(12) United States Patent
Carpenter

(10) Patent No.: US 6,538,421 B1
(45) Date of Patent: Mar. 25, 2003

(54) APPARATUS WITH SEPARATED CONDUCTORS

(76) Inventor: Warren W. Carpenter, 20 Thimble La., Hicksville, NY (US) 11801

( * ) Notice: Subject to any disclaimer, the term of this patent is extended or adjusted under 35 U.S.C. 154(b) by 0 days.

(21) Appl. No.: 09/853,647

(22) Filed: May 14, 2001

(51) Int. Cl.⁷ .......... G01R 1/02; G01R 31/08; G01R 31/00; H05F 3/00
(52) U.S. Cl. .......... 324/127; 324/117 R; 324/531; 324/508; 361/213
(58) Field of Search .......... 324/457, 127, 324/117 R, 531, 508, 142; 248/201; 439/271

(56) References Cited

U.S. PATENT DOCUMENTS

| | | | |
|---|---|---|---|
| 3,206,707 A | 9/1965 | Lo Vetere | 439/505 |
| 3,559,200 A | 1/1971 | Walters | 340/649 |
| 3,878,458 A | 4/1975 | Muska | 324/508 |
| 3,990,003 A | 11/1976 | Agee, Jr. et al. | 324/531 |
| 4,182,982 A | 1/1980 | Wolf et al. | 324/127 |
| 4,240,059 A | 12/1980 | Wolf et al. | 338/49 |
| 4,250,449 A | 2/1981 | Shum | 324/142 |
| 4,253,151 A | 2/1981 | Bouve | 700/295 |
| 4,417,196 A | 11/1983 | Cueto et al. | 323/210 |
| 4,438,396 A | 3/1984 | Harnden, Jr. et al. | 324/127 |
| 4,476,514 A * | 10/1984 | Mykkanen | 361/213 |
| 4,477,047 A * | 10/1984 | Pelczarski | 248/201 |
| 4,492,919 A | 1/1985 | Milkovic | 324/127 |
| 4,496,932 A | 1/1985 | Halder | 338/49 |
| 4,513,273 A * | 4/1985 | Friedl | 324/127 |
| 4,732,566 A | 3/1988 | Martucci | 439/106 |
| 4,780,094 A | 10/1988 | Batty et al. | 439/492 |
| 5,285,163 A | 2/1994 | Liotta | 324/508 |
| 5,297,976 A * | 3/1994 | VanDerStufy et al. | 5/93 |
| 5,339,232 A | 8/1994 | Lin | 362/391 |
| 5,716,231 A | 2/1998 | Meeker et al. | 439/502 |
| 5,781,015 A | 7/1998 | Duffin et al. | 324/508 |
| 5,811,966 A | 9/1998 | Lee | 324/157 |
| 5,917,401 A * | 6/1999 | Smith et al. | 338/49 |
| 5,962,932 A | 10/1999 | Malto | 307/126 |
| 6,091,611 A * | 7/2000 | Lanni | 363/79 |
| 6,114,847 A * | 9/2000 | Johnson | 324/127 |
| 6,216,339 B1 * | 4/2001 | Rich | 29/267 |

OTHER PUBLICATIONS

National Electric Code, Article 110–27, "Guarding of Live Parts", 1999.
Amprobe, "Tests & Measurements", Feb. 1996.

* cited by examiner

*Primary Examiner*—N. Le
*Assistant Examiner*—Wasseem H. Hamdan
(74) *Attorney, Agent, or Firm*—Michael D. Bednarek; Shaw Pittman LLP

(57) ABSTRACT

An invention including separated conductors is disclosed. The invention can assume many different embodiments. The invention includes a chassis or body adapted to receive a first conductor and second conductor, the first conductor being separated from the chassis and the second conductor a distance sufficient to accommodate a portable, handheld current-sensing device. The first conductor has an insulating jacket and is generally less flexible than the flexibility of the first conductor without the insulating jacket. In addition, the invention preferably does not influence the current flow through the apparatus and the invention continues to provide electricity even if the current detector malfunctions.

26 Claims, 20 Drawing Sheets

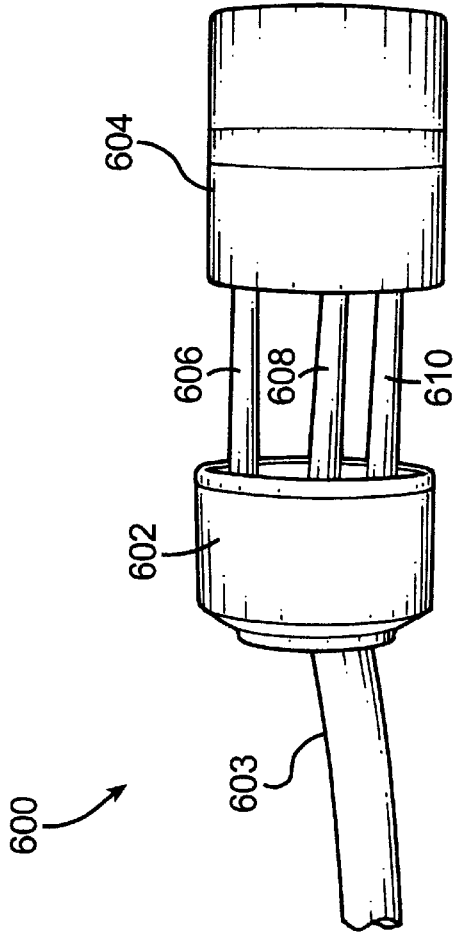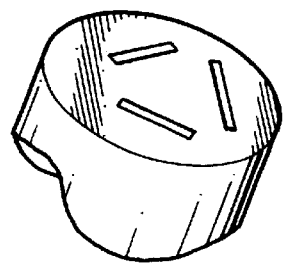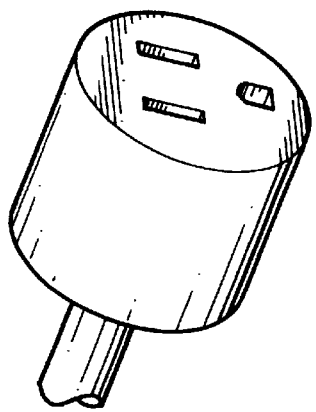

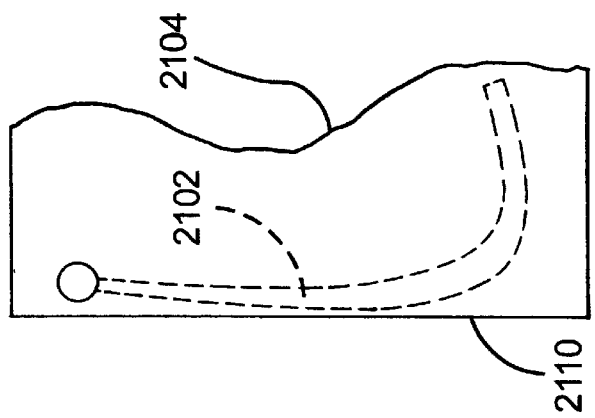
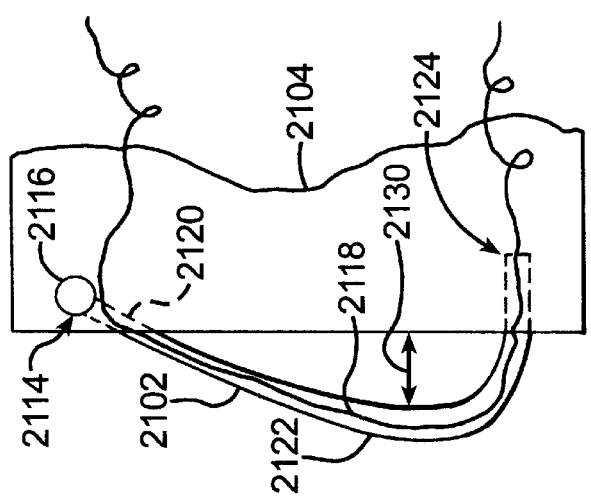
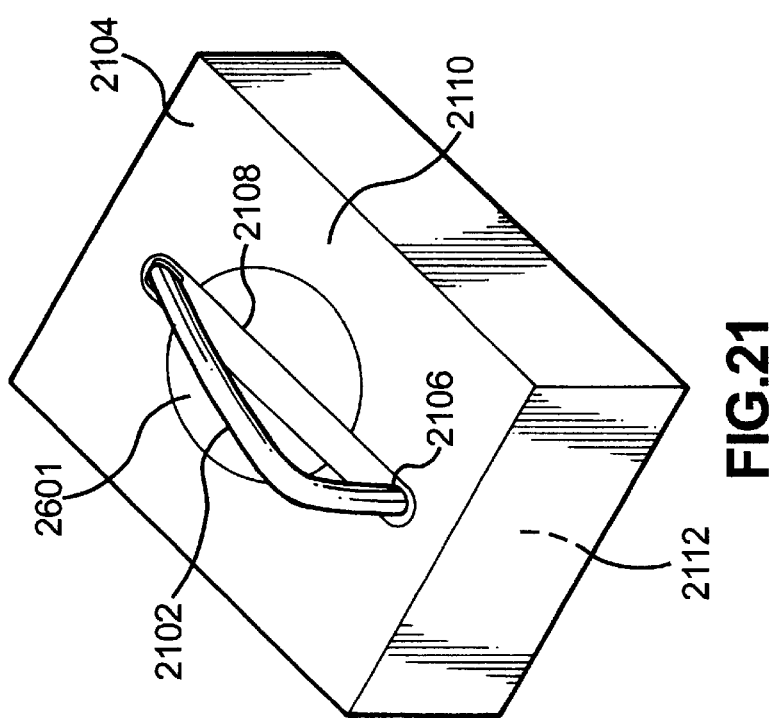

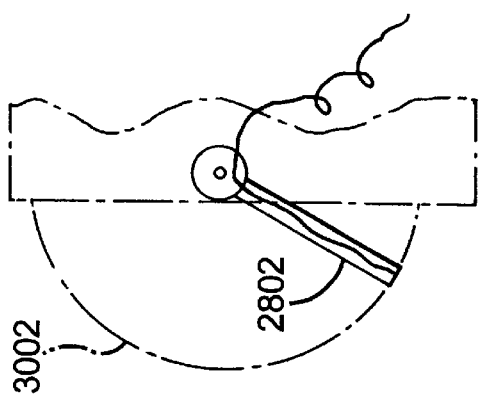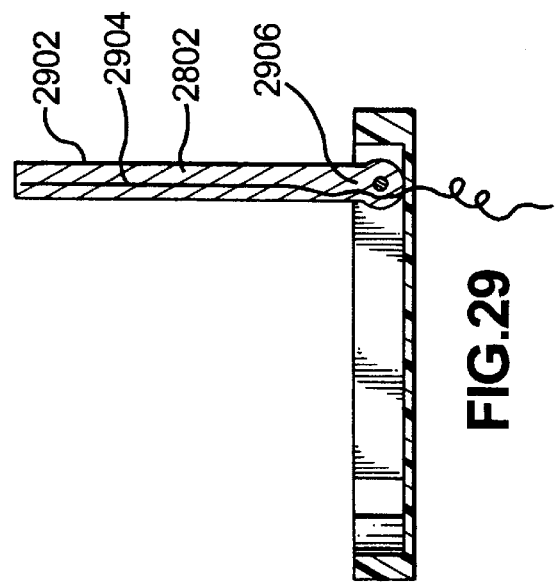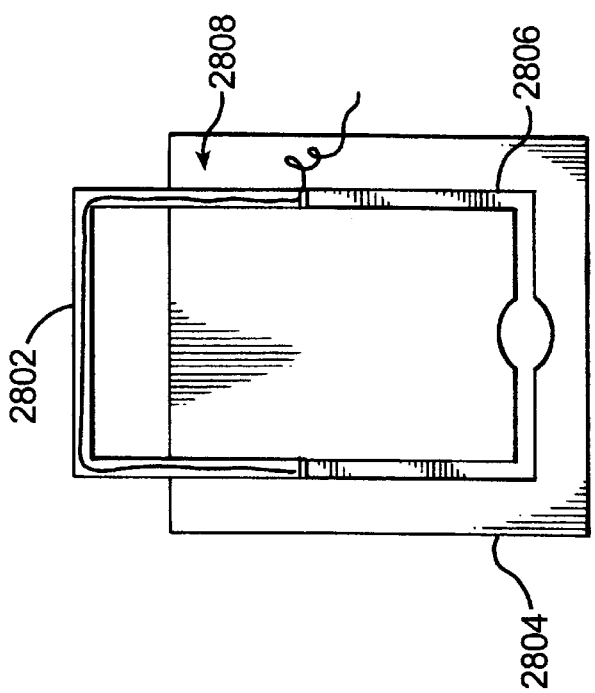

APPARATUS WITH SEPARATED CONDUCTORS

BACKGROUND

1. Field of the Invention

The present invention is directed to power delivery systems. More particularly, the present invention is directed to an apparatus that facilitates the measuring and testing of electrical power present in a circuit or delivered to a device.

2. Background of the Invention

While systems to monitor power characteristics of an electrical circuit have been proposed in the past, all of those systems suffered from shortcomings that prevented them from successful deployment in critical applications.

Most of the prior art devices cannot be used to measure current because any current measuring device placed over all of the conductors would result in an inaccurate reading of current because the power passing through the conductors would be out of phase and would result in a reading of nearly zero current flow.

U.S. Pat. No. 3,206,707 to Lo Vetere discloses an electronic circuit testing apparatus. The Lo Vetere apparatus is used for servicing tube-type radio and television sets. Lo Vetere teaches a length of insulated conductor having a bare uninsulated portion referred to as a breakout lead, and an insulating tubular sleeve frictionally fitted around the insulated conductor that can be slid along the conductor for covering and uncovering the bare insulated portion. See FIGS. 1 and 3 of Lo Vetere. The purpose of the Lo Vetere invention is to conveniently expose, disconnect, and reconnect live wires for test leads at point 3—3. See FIG. 1. This is also discussed in column 2, lines 59–67. The breakout lead of the '707 patent is attached to electronic tube sockets. This system, with energized bare conductors, would be unacceptable for any critical hardware. Use of the breakout lead could easily short-out the leads causing disruption of electrical service to the critical hardware. If any part of the monitoring circuitry failed, it could cause the power to fail, thus causing the critical hardware to fail.

The device disclosed in U.S. Pat. No. 3,206,707 is a testing device used for tube-type radio and television components like tubes, capacitors, resistors. See column 1, lines 30–37. It also connects to bare leads. The device disclosed in the '707 could not be used in a critical situations. The exposed wire leads and lack of mechanical protection of the conductors would likely cause short circuits.

This device is for use by trained technicians who would not be endangered by the exposed energized electrical leads. Because of the inherent danger of the easily exposed conductors, the apparatus must not be installed permanently in populated areas. (National Electrical Code: Article 110—27 "Guarding of Live Parts")

U.S. Pat. No. 3,559,200 to Walters discloses a monitoring unit for signaling a specific condition in the circuitry supplying power to an electrical device.

This patent monitors and records voltage used by an electrical device and takes action on the results.

The monitoring unit according to the '200 patent has electronic components attached to the power source that directly feed the critical hardware. If any part of the monitoring circuitry fails, it could cause the power to fail, thus causing any hardware to fail. The electronic components used in this device are part of the device and as such will become obsolete as time passes. The device disclosed in the Walters patent does not allow the removal or reinstallation of the metering and test equipment without interrupting the critical power supply.

The internal electronic circuitry of the apparatus uses the same electrical source that supplies the appliance being monitored. This can influence and affect the power delivered to the appliance. There are also discrete electrical connections shown in FIG. 4: conductor P and conductor 18 are connected; conductor G and conductor 19 are connected; and conductor N and conductor 20 are connected. These connections would impose an additional point of failure on the circuit. If, for any reason, any electronic component should fail, the result could change quality or characteristic of the incoming electrical power. The failure could even cause a short circuit and disrupt the power.

U.S. Pat. No. 3,878,458 to Muska discloses an electrical safety test apparatus for detecting leakage, current-tripping current and proper grounding. Muska U.S. Pat. No. 3,878,458 discloses a device designed for ground fault interruption. The apparatus is the forerunner of the receptacle commonly seen in bathrooms today. It uses, for its control circuit, the same electrical source that supplies the appliance being served. In doing so there are discrete electrical connections to conductors 25, 26, and 27.

This patent has electronic components attached to the power source that directly feed the critical hardware. If any part of the monitoring circuitry fails, it could cause the power to fail, thus causing the any hardware connected to it to fail as well. In contrast to the present invention, this device is specifically designed to interrupt power. The apparatus disclosed in the '458 patent does not allow metering and test equipment removal or reinstallation without interrupting the critical power supply.

U.S. Pat. No. 3,990,003 to Agee discloses a pulsed available conductor antenna-conduit electromagnetic radiator test technique for electromagnetic-shielding flaw detection in buried conduits and shielded conductors.

The electronic circuit testing apparatus disclosed in this patent is used for detecting buried conduit shielding flaws. The '003 patent does not have any provision to measure current or provide a place to install a current meter. This device only detects flaws in the outer metal covering (pipe or shield). A small antenna wire is installed in the pipe or cable assembly at the time of construction. The device reads the broadcast signal from this antenna wire through the side wall casing of the pipe or metal shield detecting flaws in the outer covering.

U.S. Pat. No. 4,182,982 to Wolf discloses a current-sensing transducer for power line current measurements. The device disclosed in the '982 patent is a current divider that is used to measure large magnitudes of AC current. Electric utilities use this device to meter industrial and commercial buildings. These types of devices are designed and built for specific needs and installed in locations locked away from the public. Once installed, these devices cannot be altered, removed or reinstalled with the power on.

The transducer does not directly measure the current through the tested power line. Instead, the disclosed device estimates the total power by measuring only a small portion of the power traveling through a power line. This is because the total power is mechanically split, and the Wolf '982 device must then estimate the total power by measuring the power in the portion that has been split off of the main power line.

The Wolf '982 device also includes conductors in the power circuit. In column 7 lines 29 to 32, Wolf states: "The conductors 31 and 32 are connected to opposite terminal ends 75 of the conductive member 72 and the conductors 33 and 34 are connected to opposite terminal ends 75 of the conductive member 74." Wolf also teaches components disposed between the conductors. In the Abstract, Wolf teaches: "A current-sensing transducer includes a conductive current divider including a branch path for conduction a fractional current proportional to a current to be sensed and being applied through the divider. A compensated transformer includes a primary circuit responsive to the fractional current and two secondary windings." These connections would impose an additional point of failure on the circuit. If, for any reason, any electronic component should fail, the result could change quality or characteristic of the incoming electrical power. It could even cause a short circuit and disrupt the power.

U.S. Pat. No. 4,240,059 to Wolf discloses a current divider for a current sensing transducer. The device disclosed in the '059 patent is a current divider for use in connection with a measurement of large magnitudes of AC current. Electric utilities use this device inside the typical glass meters used on homes. They are designed and built for specific needs and installed in locations sealed from the public. In other words, the Wolf '059 device is not designed to permit interaction with anyone else, other than electricians deployed by the utility company. These devices cannot be altered or tampered with by the general public particularly with the power on.

In addition, the device also includes exposed energized surfaces. In column 5, lines 22–25, Wolf states: "the pair of hot line conductors have the voltage V, typically 240 volts, 60 Hz., there across with the line currents I1 and I1' passing in series with two power line conductors." Again in column 6, lines 36–38, Wolf teaches: "a current divider of this configuration may be stamped from a sheet of any suitable conductive material such as copper or aluminum." The exposed energized surfaces of this apparatus cannot be installed permanently in areas where people are present. See National Electrical Code: Article 110-27 "Guarding of Live Parts."

The Wolf '059 device also splits or divides the current mechanically. See Abstract: "A current divider having two major current paths and a shunting current path." Since the Wolf '059 device must estimate the total power based on only a portion of the total power, the device provides a much less accurate indication of electrical activity than a direct reading.

In addition, a current-divider device like Wolf '059 would force the use of a non-standard measuring device. The current-divider would need a measuring device specifically designed to work with it. The meter would have to increase the reading by the amount of the division. For example, if the current-divider passed 25% of the current through its meter section, the meter-reading device would have to multiply the reading by 4 to get the total reading. These types of devices would not permit the use of different meters by different people. Also, it would be impossible to use standard meters because all standard meters are based on a 1-to-1 ratio. The fact that it has exposed electrical surfaces would make it dangerous not only to the people, but to the critical equipment it would serve. This device is mainly for use by an electric utility.

U.S. Pat. No. 4,250,449 to Shum discloses a digital electric energy measuring circuit. The device disclosed in this patent monitors and records voltage and amperage used by an appliance and takes action on the results. The internal electronic circuitry of the apparatus uses the same electrical source that supplies the appliance being monitored. There are discrete electrical connections, conductor 12 at point 21, and conductor 13 at point 20. See FIG. 1. These connections would impose an additional point of failure on the circuit. If, for any reason, any electronic component should fail, this could change the quality or characteristic of the incoming electrical power. It could even cause a short circuit and disrupt the power.

Shum's device is a digital electric energy measuring circuit. It can only be read visually. The measurements cannot be sent to a computer or any other monitoring device. The device also does not allow its removal or reinstallation without interrupting the critical power supply.

U.S. Pat. No. 4,253,151 to Bouve discloses an apparatus for monitoring and controlling consumer power consumption. This patent monitors and records voltage and amperage used by an appliance and takes action on the results. The Bouve device has electronic components attached to the power source that directly feed the critical hardware. The internal electronic circuitry of the apparatus uses the same electrical source that supplies the appliance being monitored. There are discrete electrical connections. See column 7, lines 29 to 31 "It is noted that power to the circuits of the apparatus is itself derived from the plug 134 by means of a conventional rectifier (not shown)." This connection would impose an additional point of failure on the circuit. If for any reason any electronic component should fail, the result could change quality or characteristic of the incoming electrical power. It could even cause a short circuit and disrupt the power.

Like other prior art devices, Bouve's device does not permit removal or reinstallation without interrupting the critical power supply and the device can only be read visually.

U.S. Pat. No. 4,417,196 to Cueto discloses a cord set with power-factor control. The apparatus disclosed in the Cueto patent is a device designed for power-conservation. The apparatus uses for its control circuit the same electrical source that supplies the appliance being served. In doing so there are discrete electrical connections between electronic components and conductors 13, 14, and 15.

The electronic components connected in series between the common power source and the output connections to the consuming appliance are: Voltage Detector (20), Current Detector (21), Phase Detector (22), Control Circuit (23), Heat Sinks (26). If, for any reason, any of these electronic components should fail the result could change quality or characteristic of the incoming electrical power or open the circuit to the critical consuming device.

The Control Circuit (23) is inherently designed to modify the output power to the consuming device. This modification is not intended to be beneficial to the consuming device, but rather to supply the least possible power to the device in order to conserve power.

U.S. Pat. No. 4,438,396 to Harmden, Jr. discloses a low cost volt/ampere meter with liquid crystal display. Harmden, Jr. discloses a device that measures electrical current and voltage. The apparatus uses, for its power needs, the same electrical source that supplies the appliance being measured. In doing so there are discrete electrical connections to conductor 31a and conductor 31b as shown in FIGS. 1 and 2 of Harmden. See also column 3, lines 9–19. This connection would impose an additional point of failure into the circuit. If, for any reason, any electronic component should fail the result could change quality or characteristic of the incoming electrical power. It could even cause a short-circuit and disrupt the power altogether.

The electronic components used in this device are part of the device and as such will become obsolete as time passes. Other products do the measuring. As better metering equipment becomes available, they can be installed on the present invention without disrupting the power supply to the critical equipment. The Harden device also does not allow its removal or reinstallation without interrupting the critical power supply.

U.S. Pat. No. 4,492,919 to Milkovic discloses a current sensor. Milkovic discloses a permanently-installed device to measure large amounts of current. The Milkovic device is a current divider for use in connection with a measurement of large magnitudes of AC current.

The Milkovic device has exposed energized surfaces. In column 2, lines 65–67, Milkovic states: "FIG. 2. Current sensor 10 utilizes a member 11 of a conductive material, such as copper and the like." The exposed energized electrical surfaces is also shown in items 12 and 2a (see FIG. 1); items 11, 11a, 11b, 11c, 11d, 12a, 12b (see FIGS. 2and 2a); items 40, 40a, 40b, 40-3 (see FIG. 2b). These exposed surfaces are inherently dangerous. The exposed energized surfaces of this apparatus must not be installed permanently in areas populated by people. (National Electrical Code: Article 110–27 "Guarding of Live Parts.")

Column 4, lines 33–39 states: "The current 12 flowing in sensing-branch member 14 is sensed by a current transformer 16. The transformer utilizes element 14 as a single-turn primary winding passing through a core 16a upon which a multi-turn secondary winding 16b is wound. Transformer 16 is placed about member 14 prior to the installation and fastening of the latter within slots 11g." Also, column 5, second paragraph states: "This analog AC output voltage V0 can be directly utilized, or can be converted to digital data by means of an analog-to-digital converter 26 having its input connected to terminal 24a." From those portions, it is clear that the Milkovic device includes electrical components connected directly to the critical power circuit. If those components were to fail, they could interrupt the power delivered in the power circuit.

The Milkovic device also splits or divides the current mechanically. Because of this, the Milkovic device would suffer from the same disadvantages as Wolf '059, discussed above.

U.S. Pat. No. 4,496,932 to Halder discloses a current divider for current measurement in conjunction with a measurement transducer. The device disclosed in the Halder patent is a permanently installed device to measure large amounts of current. The patent does not allow the metering and test equipment to be removed or reinstalled without interrupting the critical power supply. In addition, Halder includes exposed energized surfaces. See column 3, lines 64–68. This device is not suitable for use where people are present.

U.S. Pat. No. 4,732,566 to Martucci discloses an electrocution proof line and extension cord. The patent includes features that attempt to prevent electrocutions due to improper wiring. The present invention is diametrically opposed in use and construction. The Martucci device is used to protect human life, while the present invention is intended to protect critical equipment. Martucci discloses an electrocution proof line and extension cord; it is not intended to be used for testing or monitoring.

U.S. Pat. No. 4,780,094 to Batty discloses an extension cord of under carpet flat cable. The Batty device is an extension cord expressly made to lie flat under carpeting. It is not used for testing or monitoring.

U.S. Pat. No. 5,285,163 to Liotta discloses an electrical cable continuity and voltage tester. The Liotta device tests whether power to stage (theatrical) lighting is on or off. The Liotta reference does not include provisions to measure the amount of current drawn. It is a self-contained digital device showing on and off only.

The internal electronic circuitry of the apparatus uses the same electrical source that supplies the appliance being monitored. There are discrete electrical connections to conductor N and conductor H. See FIG. 3. This connection would impose an additional point of failure on the circuit. If, for any reason, any electronic component should fail, the result could change quality or characteristic of the incoming electrical power. It could even cause a short circuit and disrupt the power. Additionally, the Liotta device does not allow a technician to install current metering equipment into the circuit without power interruption.

U.S. Pat. No. 5,339,232 to Lin discloses a miniature light set and does not teach any measurement features.

U.S. Pat. No. 5,716,231 to Meeker discloses a sensor breakout lead. The sensor breakout lead is described as, "a length of insulated conductor having a bare uninsulated portion, and an insulating tubular sleeve coaxially and frictionally fitted around said insulated conductor and slidably movable therealong for covering and uncovering the bare insulated portion." See column 2, lines 4–13 and FIGS. 1–3. This patented breakout lead is attached to the power source that directly feeds the critical hardware. This system with energized bare conductors would be unacceptable servicing critical hardware. If any part of the monitoring circuitry failed, it could cause the power to fail, thus causing the critical hardware to fail. The present invention has no attachment to the power supply. All testing is done through induction.

This device is for the use of trained technicians that would not be endangered by the exposure of energized electrical leads. Because of the inherent danger of the easily exposed conductors, the apparatus must not be installed permanently in areas populated by people. (National Electrical Code: Article 110-27 "Guarding of Live Parts")

The Meeker device would be unsuitable for mission-critical equipment because the device would require the mission-critical equipment to be turned off to install the Meeker device. After the testing were completed, the mission-critical equipment would have to be turned off again and disconnected from its power source. The Meeker device would be removed and then the mission-critical equipment would be reconnected from its power source. Forcing mission-critical equipment to be disconnected from its power source in order to test the power lines is exactly what the present invention is trying to eliminate.

U.S. Pat. No. 5,781,015 to Duffin discloses an extension cord with integral monitoring system. The presence of voltage lights up an LED lamp and if an attached an appliance is consuming power, the device will light up a second LED lamp. In other words, the Duffin reference teaches an indicating device.

The internal electronic circuitry of the Duffin device uses the same electrical source that supplies the appliance being monitored. There are discrete electrical connections to conductor 28 and conductor 29. See FIG. 1. This connection would impose an additional point of failure on the circuit. If, for any reason, any electronic component should fail, the result could change quality or characteristic of the incoming electrical power. It could even cause a short circuit and disrupt the power. In addition, the Duffin reference does not allow removal or reinstallation without interrupting the critical power supply.

U.S. Pat. No. 5,811,966 to Lee discloses a meter for measuring and displaying the power consumption of an electrical appliance and the time period for the power consumption. The Lee device monitors and records voltage and amperage used by an appliance and takes action based on the results.

The internal electronic circuitry of the apparatus uses the same electrical source that supplies the appliance being monitored. There are discrete electrical connections to conductor (Neutral) and conductor (Hot) in FIG. 2. This connection would impose an additional point of failure on the circuit. If, for any reason, any electronic component should fail, the result could change quality or characteristic of the incoming electrical power. It could even cause a short circuit and disrupt the power. In addition, the Lee device does not allow removal or reinstallation without interrupting the critical power supply.

U.S. Pat. No. 5,962,932 to Matlo discloses a power supply apparatus with circuit load sensor. Specifically, the Malto device is an extension cord with a led lamp that indicates whether power is flowing through the device. The Matlo device monitors and records voltage and amperage used by an appliance and takes action on the results. The internal electronic circuitry of the apparatus uses the same electrical source that supplies the appliance being monitored. There are discrete electrical connections to conductor 32 (Neutral) and conductor 31 (Hot) in sheet 1 of 2. This connection would impose an additional point of failure on the circuit. If, for any reason, any electronic component should fail, the result could change quality or characteristic of the incoming electrical power. It could even cause a short circuit and disrupt the power. The Malto device does not permit the metering and test equipment to be removed or reinstalled without interrupting the critical power supply.

SUMMARY AND OBJECTS OF THE INVENTION

The present invention is directed to an apparatus that permits the electrical activity of an electrical conductor to be conveniently measured. The invention includes the use of separated conductors. The invention can assume many different embodiments. The invention includes a chassis adapted to receive a first conductor and second conductor, the first conductor being separated from the chassis and the second conductor a distance sufficient to accommodate a portable, handheld current-sensing device. The first conductor has an insulating jacket and is generally less flexible than the flexibility of the first conductor without the insulating jacket. In addition, the invention preferably does not influence the current flow through the apparatus and the invention continues to provide electricity even if the current detector malfunctions.

An object of the present invention is to provide a location where current, power, or load of a circuit can be conveniently measured.

Another object of the present invention is to provide a device that has no exposed energized parts and is specifically designed to coexist with people in any environment.

Another object of the present invention is to provide a device that is totally insulated, mechanically protected and cannot cause interruption to the critical hardware while installing or removing amperage test and monitoring equipment.

Another object of the present invention is to provide a place to install amperage-metering devices without disrupting the electrical power.

Another object of the present invention is to provide a device that is not exposed to short or open circuits.

Another object of the present invention is to permit other products to do the measuring. As better metering equipment becomes available, it can be installed without disrupting the power supply to the critical equipment.

Another object of the present invention is to allow test equipment to be removed and reinstalled without disruption of the power supply to the critical hardware.

Another object of the present invention is to eliminate any attachment to the power supply that is being monitored.

Another object of the present invention is to permit test equipment to be removed and reinstalled without disruption of the power supply.

Another object of the present invention is to provide an available conductor that can move from a deployed position to a non-use position.

Additional features and advantages of the invention will be set forth in the description which follows, and in part will be apparent from the description, or may be learned by practice of the invention. The objectives and advantages of the invention will be realized and attained by the structure and steps particularly pointed out in the written description, the claims and the drawings.

BRIEF DESCRIPTION OF THE DRAWINGS

FIG. 6 is aside view of a socket according to a preferred embodiment of the present invention.

FIGS. 7A–7G are isometric views male and female electrical connectors according to an embodiment of the present invention.

FIG. 21 is an isometric view of preferred embodiment of a movable available conductor.

FIG. 22 is a cross-sectional view of a preferred embodiment of a movable available conductor.

FIG. 23 is a cross-sectional view of a preferred embodiment of a movable available conductor in a non-use position.

FIG. 28 is a top view of another embodiment of a movable available conductor.

FIG. 29 is a cross sectional view of another embodiment of a movable available conductor.

FIG. 30 is a schematic diagram of another embodiment of a movable available conductor showing a range of motion.

DETAILED DESCRIPTION OF A PREFERRED EMBODIMENT(S)

Figure 1:
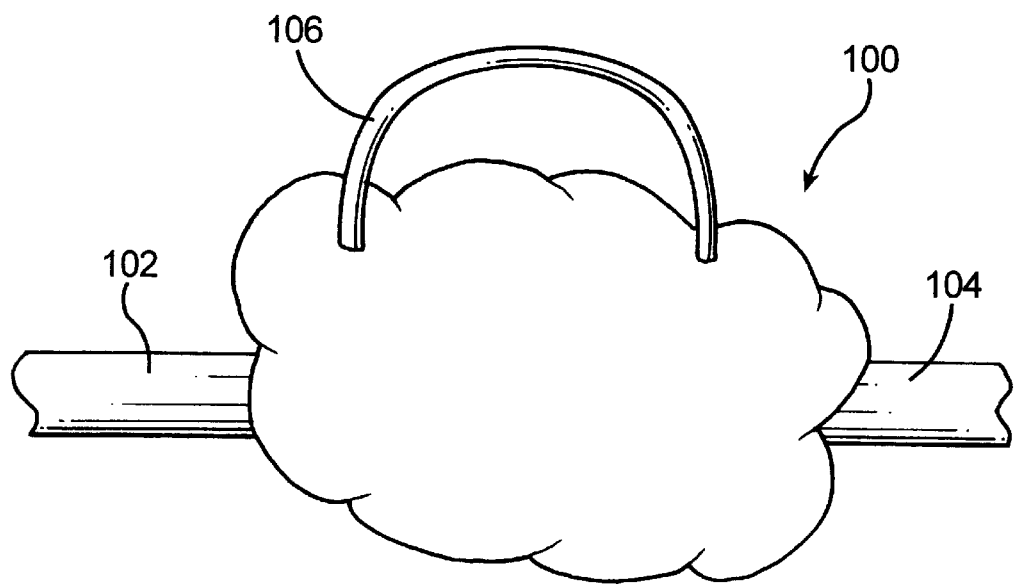
FIG. 1 is a generalized view of a preferred embodiment of the present invention.
Figure 2:
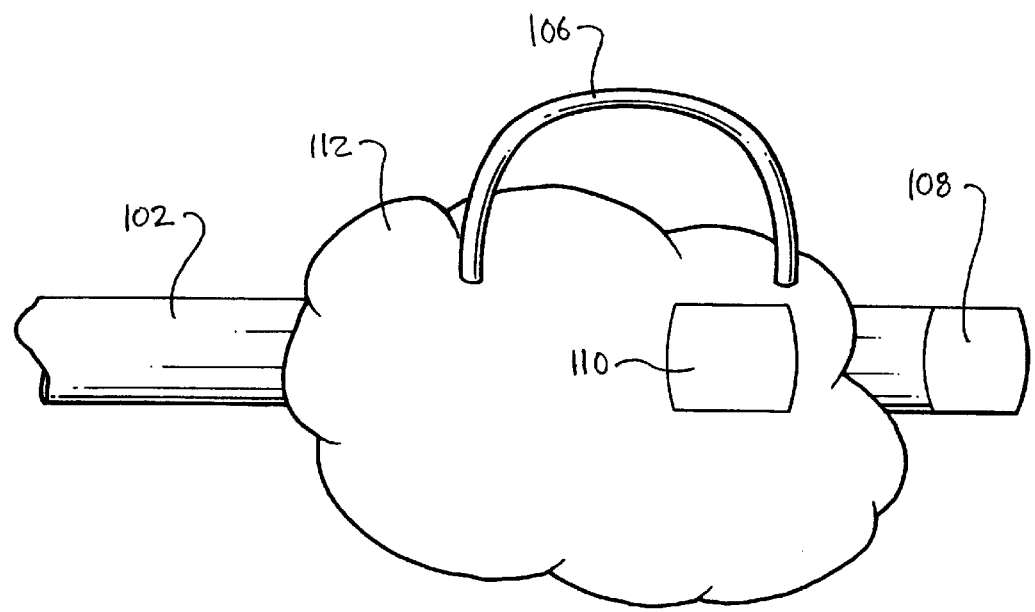
FIG. 2 is a generalized view of another preferred embodiment of the present invention.
Figure 3:
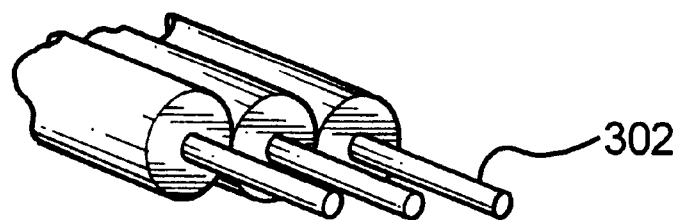
FIG. 3 is an enlarged view of several conductors.
Figure 4:
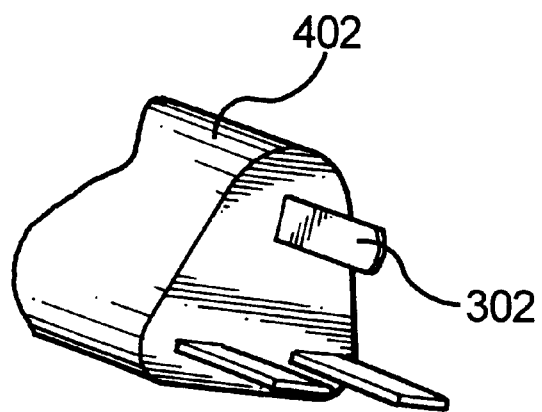
FIG. 4 is an enlarged view of several conductors.

FIGS. 1 and 2 are schematic diagrams of two generalized embodiments of the present invention. FIG. 1 is a schematic diagram of a generalized embodiment here multiple conductors extend through apparatus 100. Multiple conductors are collected together and comprise input cord 102, which enters apparatus 100. Multiple conductors are also collected together to comprise exit cord 104. As shown in FIG. 1, cord 104 exits apparatus 100. Any number of conductors can be collected to comprise cords 102 and 104. Preferably, two or three conductors are collected together to comprise cords 102 and 104. Preferably, the conductors are associated with one another. Preferably, the conductors 302 are insulated with a suitable insulation, and are attached or joined together, as shown in FIG. 3. In other words, each conductor 302 that is adapted to be monitored includes an insulating jacket and a non-ferrous (for example, plastic) outer jacket, or a single jacket that acts as both an insulating jacket and an outer jacket. In other embodiments, the insulated conductors 302 are held in a jacket or cover 402 (see FIG. 4).

Returning to FIG. 1, apparatus 100 includes an available conductor 106. Available conductor 106 preferably includes only one of the multiple conductors. Available conductor 106 is preferably also insulated and "rigid," as the term is used to describe an available conductor in this disclosure. In this disclosure, the term "rigid," when referring to an available conductor, means that the available conductor is made more rigid (less flexible) than the conductor alone. This rigidity can be derived from geometry and configuration, that is, the shape, size, and physical characteristics of the available conductor impart greater rigidity. The rigidity can also be derived from the additional materials that are disposed proximate to the conductor that is part of the available conductor. For example, an insulating material can be disposed around the conductor and the material, shape, size or geometry of the insulator can impart rigidity to the available conductor. Furthermore, the rigidity can come from a combination of the physical characteristics of the available conductor and additional material disposed about the internal conductor of the available conductor. "Rigid" can also include the conventional meaning of the word and mean substantially devoid of flexibility.

FIG. 2 shows another generalized embodiment of the present invention. A first or input cord 102 engages a portion of body 112. Instead of an output or second cord 104, as shown in FIG. 1, the embodiment shown in FIG. 2 includes an electrical connector. Electrical connector 108 can protrude out of body 112, or electrical connector 110 can be embedded or recessed within body 112. The electrical connector can be either a male or female connector.

Figure 5:
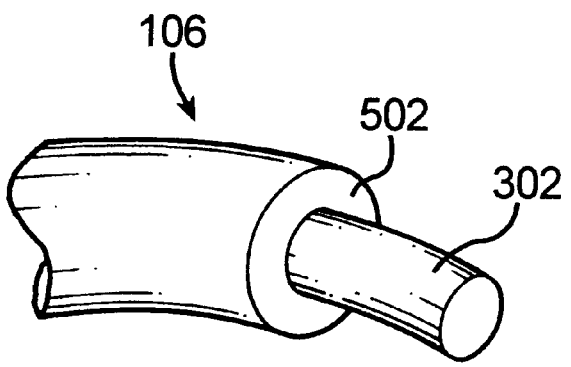
FIG. 5 is an enlarged view of a single conductor.

FIG. 5 shows an enlarged view of available conductor 106 at cross-section 5—5. Conductor 302 is preferably made of a conducting material. Available conductor 106 also preferably includes an insulator 502. Preferably, insulator 502 provides physical protection to conductor 302 and also prevents inadvertent contact with conductor 302.

As shown in FIG. 1, available conductor 106 is preferably sized to accommodate a portable, hand-held current-sensing device. Available conductor 106 can be designed in many different ways. Available conductor 106 can protrude outwards of body 112, as shown in FIGS. 1 and 2. As shown in other embodiments, the available conductor can also be recessed or be made movable. One example of a suitable portable, hand-held current-sensing device is a portable ammeter. Some examples of ammeters that can be used with available conductor 106 are:

Ideal Test-Pro Current Clamp Head (61-450)
BK Precision IT149, IT150, 3GD37, 3GD38 Clamp-on Ammeters
Extech 4KC22, 4KC23, 4KC24, 4KC25, 4TM12, 4PC53, 4PC56, 4PC57 Clamp-On Ammeters
Fluke 3LV91, 3LV92, 1W548, 1W554, 1W550, 6T127, 6T228 Digital Clamp-on Meters
Aemc Power Meter 2T592
Extech Clamp-On Power Datalogger 3ZH82
Amprobe Rotary Scale Analog Clamp-On Meters RS-1, RS-1007S, RS-3A, RS-3, RS-3SUPER, TM33A, TM43ATM63, FS-3L, FS-3
Amprobe Digital Calmp-On Meters ACD-10 SUPER, ACD-11, ACD-8A, ACD-9A, ADDC-1000, ACD-12, ACDC-600A, ACDC-610, ACD-2000A, ACD-2001A, ACDC-600AT, ACDC-3000, ACDC-620T, ACD-33DT Other similar portable ammeters can also be used with available conductor 106. The concept of being sized to accommodate a current-sensing device means that available conductor 106 is sized and spaced in a manner that permits an existing, unmodified, portable current-sensing device to engage and measure the electrical activity of available conductor 106.

FIG. 6 shows a female plug embodiment of the present invention. This female plug embodiment 600 includes a first portion 602 and a second portion 604. A conventional cord 603 enters one end of the first portion 602. Although this embodiment, and the present invention as a whole, can be used with any type of cord with any number of conductors, for simplicity, a three-conductor cord is used to demonstrate the principles of this present embodiment.

The first and second portions 602 and 604 respectively, are separated by a series of available conductors. First available conductor 606, second available conductor 608 and third available conductor 610 emanate from the second end of the first portion 602 and extend between the first portion 602 and the second portion 604.

Preferably, each of the available conductors 606, 608 and 610 includes one of the three conductors. Preferably, the available conductors 606, 608 and 610 include an indicia to indicate the use of the particular conductor. Words, symbols, or one or more colors could also be used to label the conductors. For example, the hot (positive) conductor could be colored red, the cold (negative) conductor could be colored white, and the ground conductor could be colored green or white with a green stripe.

The available conductors 606, 608, and 610 are arranged to provide spacing between each other. The spacing is preferably designed and sized to accommodate existing current-sensing devices. In an exemplary embodiment of the present invention, the available conductors 606, 608, and 610 are disposed in a manner that accommodates portable, hand-held current-sensing devices, similar to the one shown in FIG. 8.

Figure 7E:
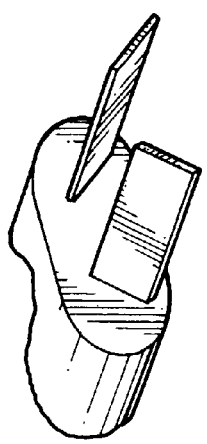
Figure 7G:
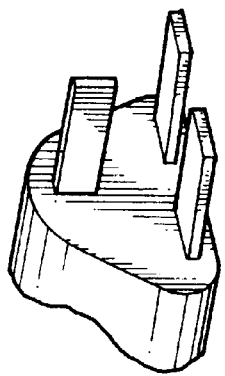
Figure 7D:
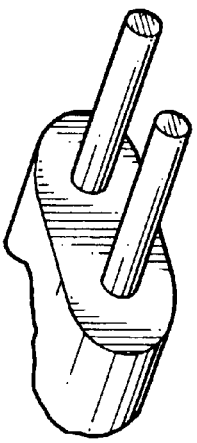
Figure 7C:
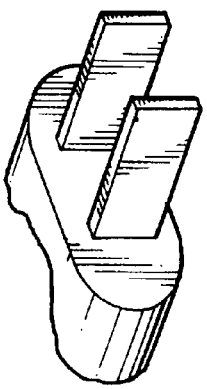
Figure 7F:
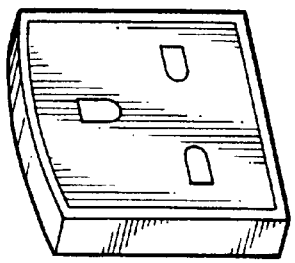

The conductors contained in available conductors 606, 608 and 610 extend into second portion 604. Those conductors are electrically connected to female electrical connectors. Various different types of female electrical connectors may be used with the present embodiment and with the present invention. FIG. 7A shows a typical 110 volt three-prong, grounded female electrical connector. FIG. 7B shows a typical 220 Volt three-prong, grounded female electrical connector. FIGS. 7C–7G show other types of connectors that can also be used with the present invention.

FIG. 6 shows a second portion 604 that includes female electrical connectors. It is possible to replace the female electrical connectors shown in FIG. 6 with other types of electrical elements. For example, other embodiments of the invention include an inline portion 801 (see FIG. 8). Inline portion 801 has a second cord 810 emanating from one side of inline portion 801. In this way, the apparatus, which includes a first portion 602 and a second inline portion 801 in this embodiment, can be disposed along a chord with no user removable electrical connections. Similarly, second portion 604 (see FIG. 6) can be replaced with a male plug portion 901 (see FIG. 9).

Figure 8:
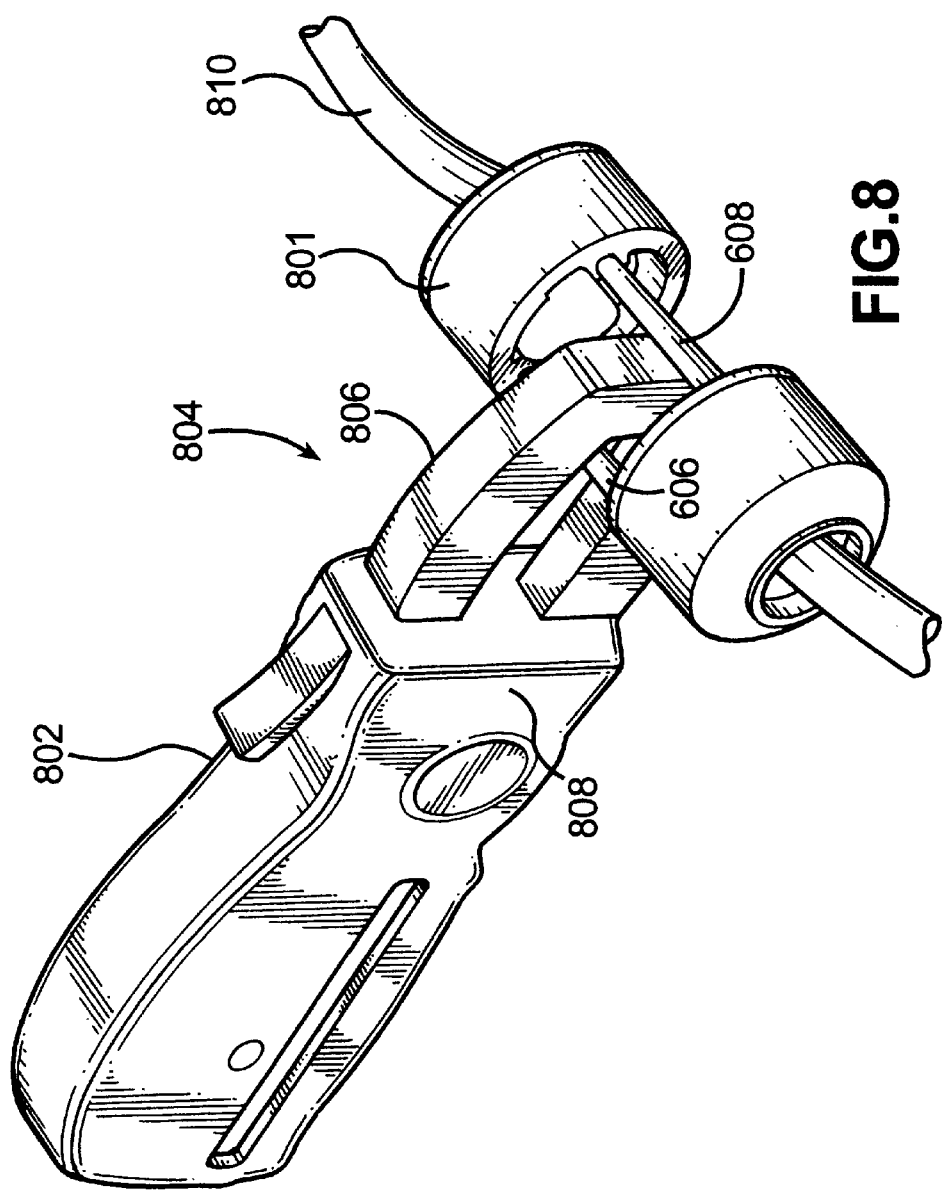
FIG. 8 is an isometric view of a measuring device engaging an embodiment of the present invention.
Figure 9:
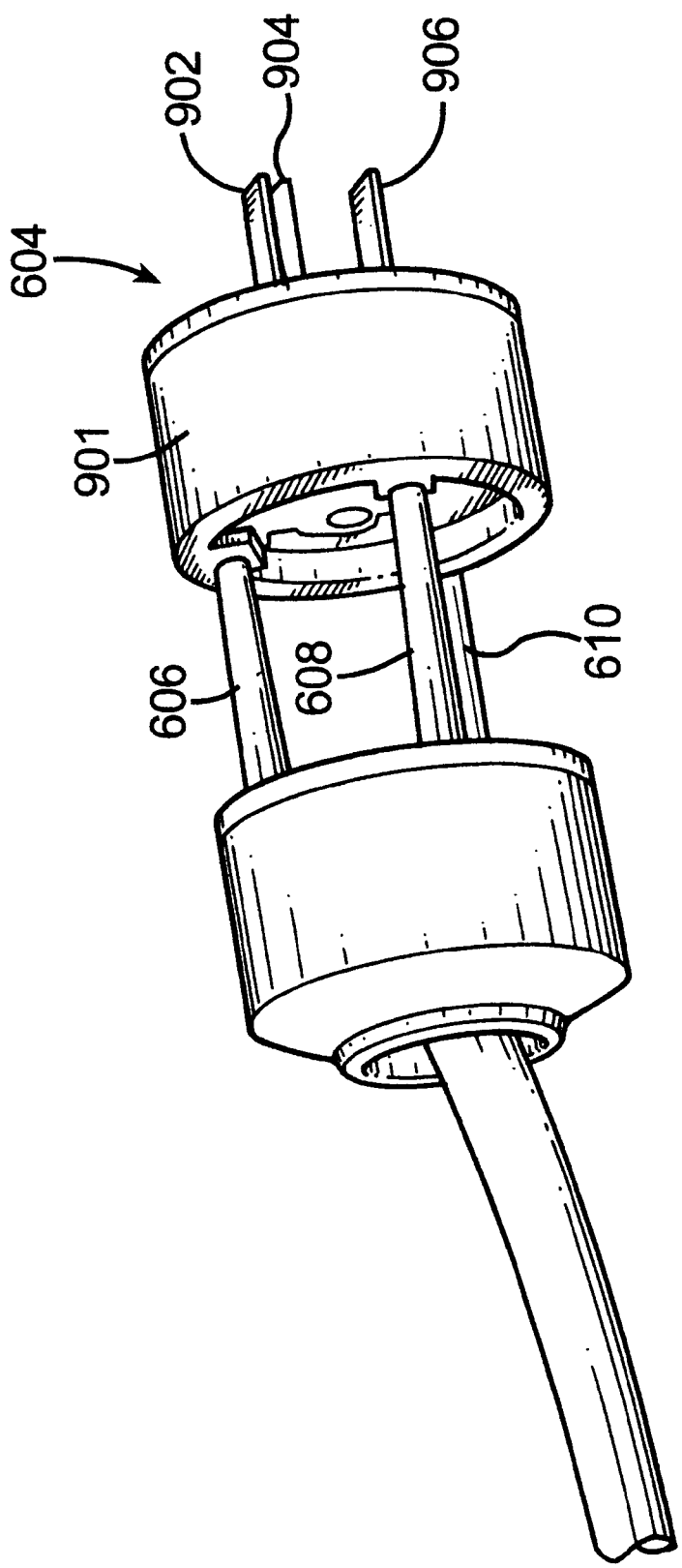
FIG. 9 is a side view of a preferred plug embodiment according to the present invention.

FIG. 8 shows an embodiment of the present invention with a current-sensing device 802 engaged with an available conductor 606. Current-sensing device 802 has a sensing portion 804. Sensing portion 804 includes two fingers or jaws of the clamp-on meter, a first finger 806 and a second finger 808. The two fingers 806 and 808 enclose a wire that is intended to be sensed. Preferably, this embodiment is designed to permit any of the available conductors 606, 608 and 610 to be sensed. Alternatively, this embodiment can be designed to permit one or several, but not all of the available conductors to be sensed.

Figure 10:
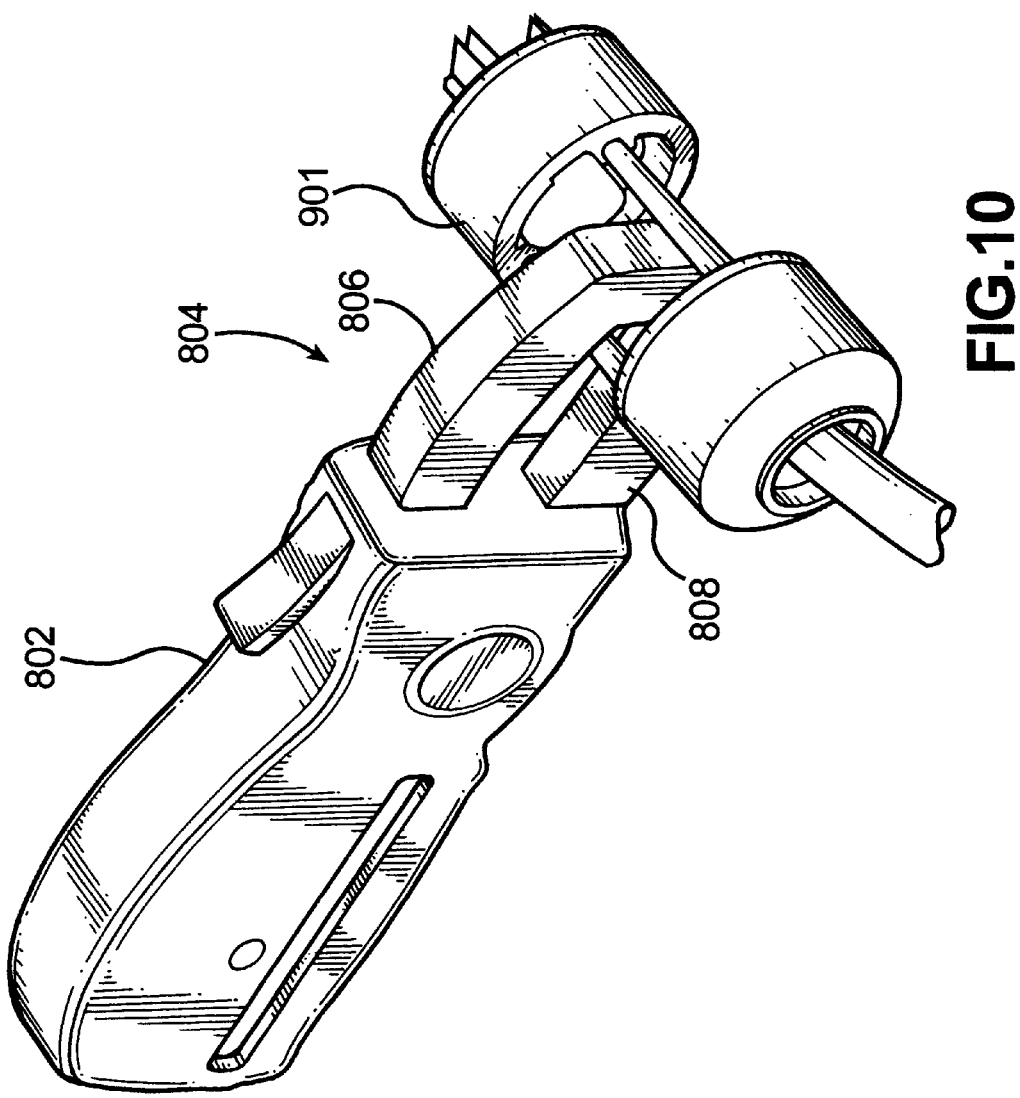
FIG. 10 is an isometric view of a measuring device engaging a plug embodiment according to the present invention.

In FIG. 8, available conductor 606 is being sensed by current-sensing device 802. Available conductor 608 and available conductor 610 are spaced away from available conductor 606 to provide enough space for fingers 806 and 808 to embrace available conductor 606. Any suitable spacing can be used. The available conductors can also be curved to provide additional space for a current-sensing device. FIG. 10 shows an embodiment of the present invention with a current-sensing device 802 engaged with an available conductor 606. Current-sensing device 802 has a sensing portion 804. Sensing portion 804 includes two fingers, a first finger 806 and a second finger 808. The two fingers 806 and 808 enclose a wire that is intended to be sensed. Preferably, this embodiment is designed to permit any of the available conductors 606, 608 and 610 to be sensed. Alternatively, this embodiment can be designed to permit one or several, but not all of the available conductors to be sensed.

As noted above, FIG. 9 shows an embodiment of the invention where second portion 604 includes a male plug portion 901. Mail plug portion 901 includes three male electrical connectors 902, 904 and 906. Any suitable or desired electrical connector may be used with the present invention. Preferably the male connectors are configured in a manner similar to and corresponding with the female connectors shown in FIGS. 7A–7G. In other words, preferably the male connectors 902, 904 and 906 are designed to mate with the female connectors shown in the various embodiments shown in FIG. 7.

Similar to the configuration shown in FIG. 8, FIG. 10 shows an embodiment of the present invention with a current-sensing device 802 engaged with an available conductor 606. Current-sensing device 802 has a sensing portion 804. Sensing portion 804 includes two fingers, a first finger 806 and a second finger 808. The two fingers 806 and 808 enclose a wire that is intended to be sensed. Preferably, this embodiment is designed to permit any of the available conductors 606, 608 and 610 to be sensed. Alternatively, this embodiment can be designed to permit one or several, but not all of the available conductors to be sensed.

Figure 11:
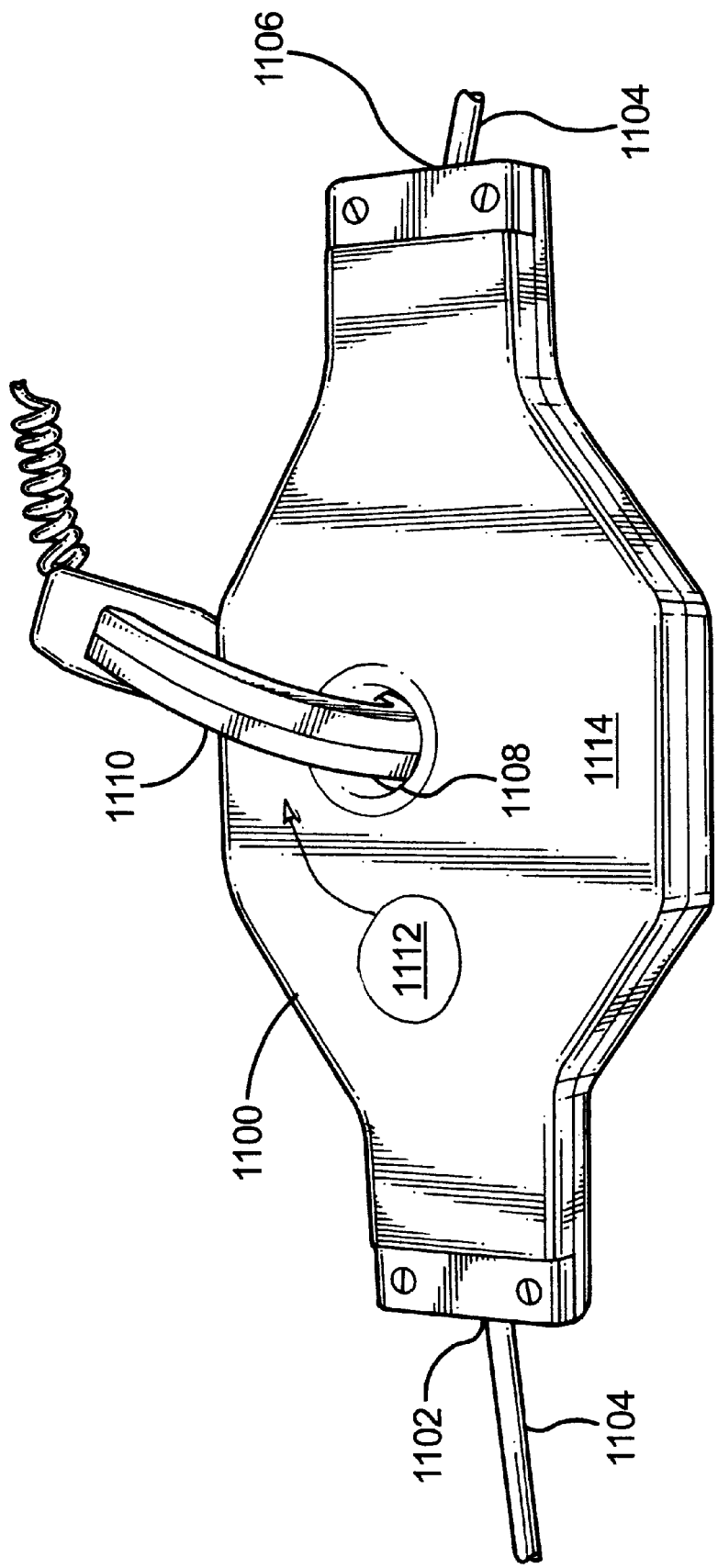
FIG. 11 is a top view of a measuring device engaging an inline embodiment of the present invention.

FIG. 11 shows another embodiment of an inline device. Inline device 1100 includes an inlet 1102 where a power cord 1104 enters the device and an outlet 1106 where power cord 1104 exits the device. Inline device 1100 also includes a hole 1108. Hole 1108 is preferably sized to accommodate a current-sensing device 1110. Preferably, inline device 1100 is designed asymmetrically so that a first portion 1112 has a different shape or size than a second portion 1114. Preferably the first portion 1112 is sized to accommodate a current-sensing device 1111 whereas the second portion 1114 is designed expressly to prohibit a current-sensing device 1110 from engaging the inline device 1100 at second portion 1114. In other words, inline device 1100 includes an asymmetrical outer surface that permits current-sensing device 1110 to engage inline device 1100 at only one side and does not permit current-sensing device 1110 to engage inline device 1100 from the opposite side.

Figure 12:
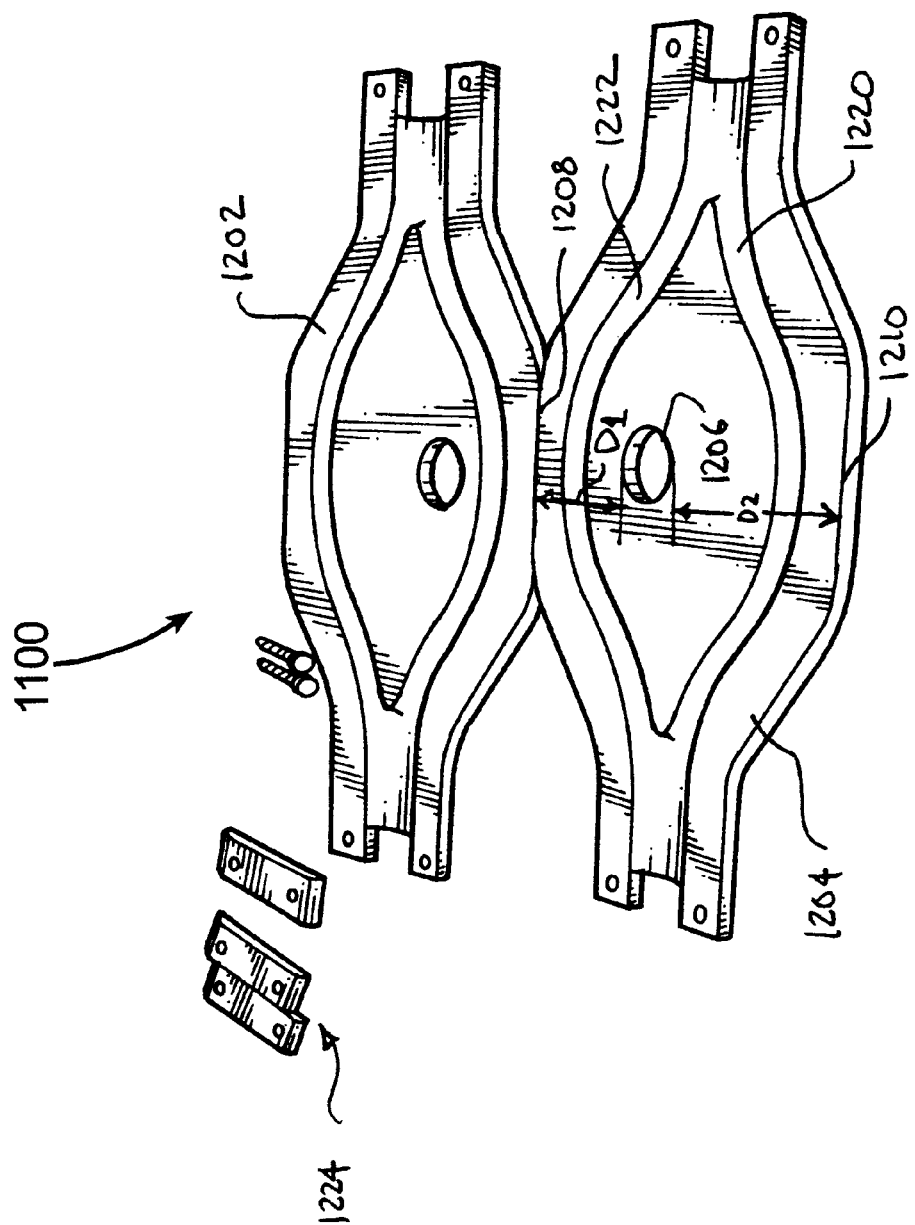
FIG. 12 is a disassembled view of the inline embodiment according to the present invention.

Inline device 1110 is preferably a kit that includes several components. Referring to FIG. 12, inline device 1100 includes a first half-shell 1202 and a second half-shell 1204. Preferably, the two half-shells 1202 and 1204 comprise mirror image halves of inline device 1110. Because of this, and for clarity, details of second half-shell 1204 are disclosed while details of half-shell 1202 are omitted. Clearly, because the two half-shells are mirror images of one another, the details of second half-shell 1204 apply also to first half-shell 1202.

Like the assembled inline device shown in FIG. 11, second half-shell 1204 includes a hole 1206. Hole 1206 is preferably located a first distance D1 from a first side 1208 and a second distance D2 from a second side 1210. Preferably, those distances D1 and D2 are different. In an exemplary embodiment, distance D1 is a distance that can accommodate a portable hand-held current sensing device. In other words, a portable hand-held current sensing device can engage hole 1206 from first side 1208 because distance D1 is small enough to permit the engagement. In contrast, distance D2 is specifically designed to prevent a portable hand-held current sensing device from engaging hole 1206 from that second side 1210.

Second half-shell 1204 also includes two grooves 1220 and 1222. Grooves 1220 and 1222 are designed to accommodate an insulated conductor. They are preferably sized so that the two half-shells 1202 and 1204 can close tightly when insulated conductors are disposed within grooves 1220 and 1222. In an exemplary embodiment, one conductor is disposed in groove 1222 while the remaining conductors are disposed in groove 1220. As shown in FIG. 12, groove 1222 also traverses inline device 1100 between hole 1206 and first side 1208. This is also the only side of inline device 1100 that a portable hand-held current sensing device can engage. In this way, inline device assures that only the electrical activity of a single conductor disposed in groove 1222 is sensed and that inline device provides accurate readings.

The two half-shells 1202 and 1204 can be joined in many different ways. Preferably, suitable hardware 1224 is provided with inline device 1100 if inline device is sold as a kit. The kit can be purchased, and the customer can install inline device 1100 in any existing power cord. All that is required for installation is for the customer cut away a portion of the jacket surrounding the conductors, separate the conductors, dispose a single conductor in groove 1222 and the remainder of the conductors in groove 1220, and assemble the half-shells 1202 and 1204.

Figure 13:
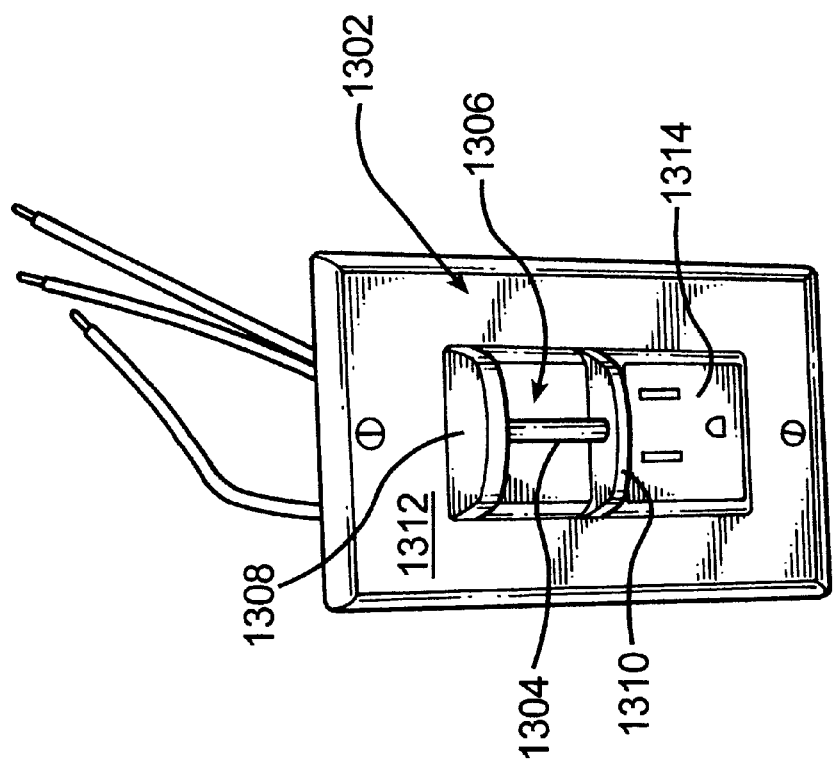
FIG. 13 is an outlet assembly embodiment according to the present invention.

In another embodiment of the present invention, shown in FIG. 13, a place to sense electrical activity is provided in an outlet assembly 1300. Preferably, sensing location 1302 takes the place of an outlet and provides a location where electrical activity can be sensed. Preferably, sensing location 1302 includes at least one available conductor 1304, a rear wall 1306, an upper support 1308, and a lower support 1310. Preferably, available conductor 1304 is disposed between upper support 1308 and lower support 1310. Although the embodiment shown in FIG. 13 shows upper and lower supports 1308 and 1310, respectively, projecting outward, those supports 1308 and 1310 could also be recessed inward with respect to mounting plate 1312. In other words, sensing location 1302 would be recessed and the outer face of outlet assembly 1300 would be flush.

Preferably, the spacing between upper support 1308 and lower support 1310 would be large enough to accommodate a sensing device. In the same way, the distance between available conductor 1304 and rear wall 1306 would be great enough to accommodate a sensing device. Preferably, available conductor 1304 would be rigid and insulated. Available conductor 1304 could be connected to outlet 1314 disposed on outlet assembly 1300 or optionally, available conductor 1304 could be connected to another power circuit.

Figure 14:
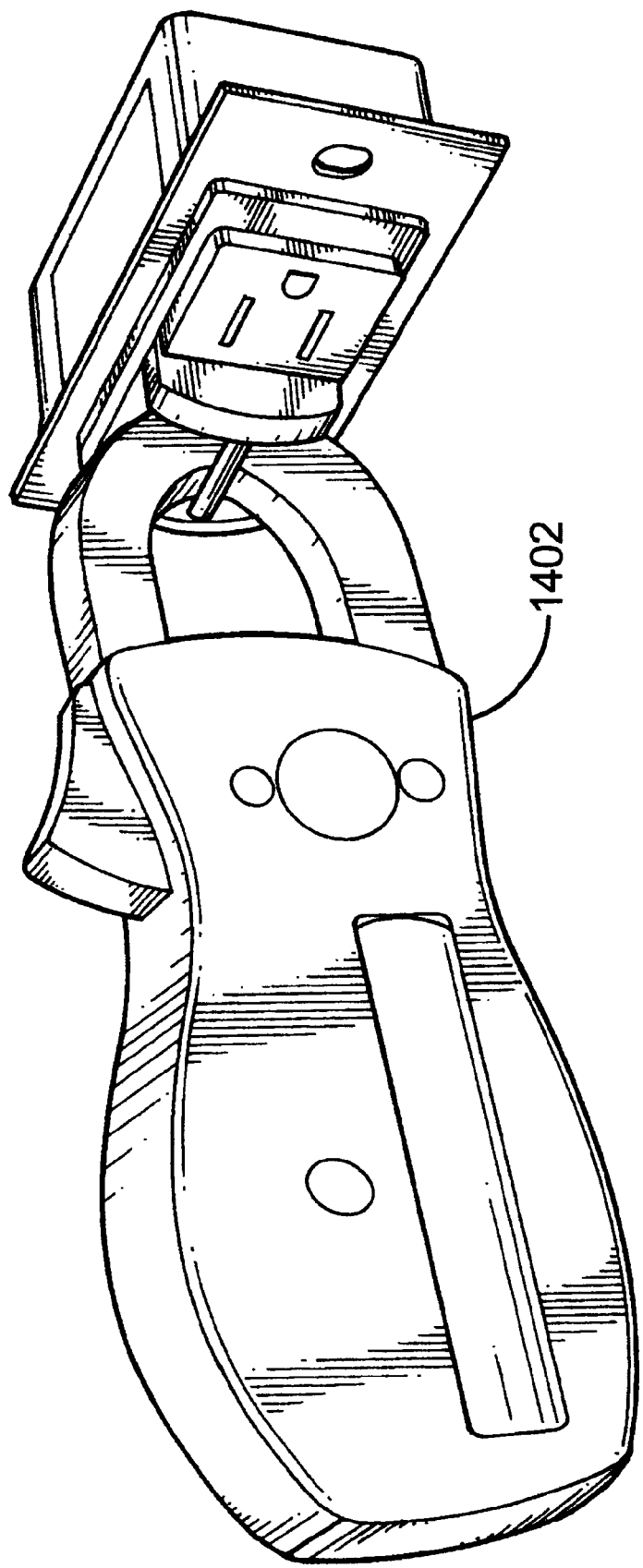
FIG. 14 is a measuring device engaging the preferred outlet assembly according to the present invention.

FIG. 14 shows a sensing device 1402 engaging available conductor 1304 of outlet assembly 1300. Obviously, outlet assembly 1300 could be mounted to a wall or other support.

Figure 15:
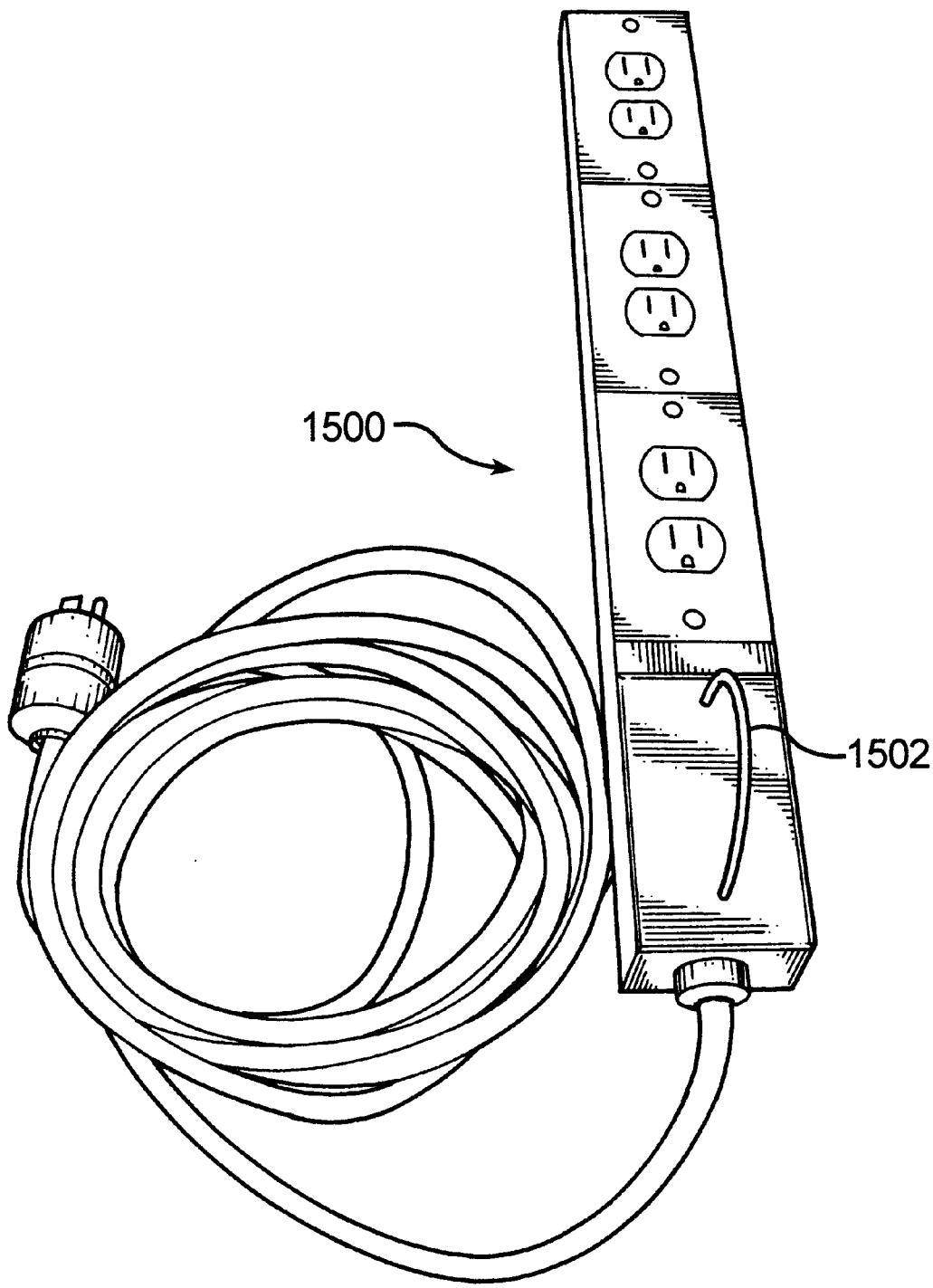
FIG. 15 is a power strip embodiment according to the present invention.
Figure 16:
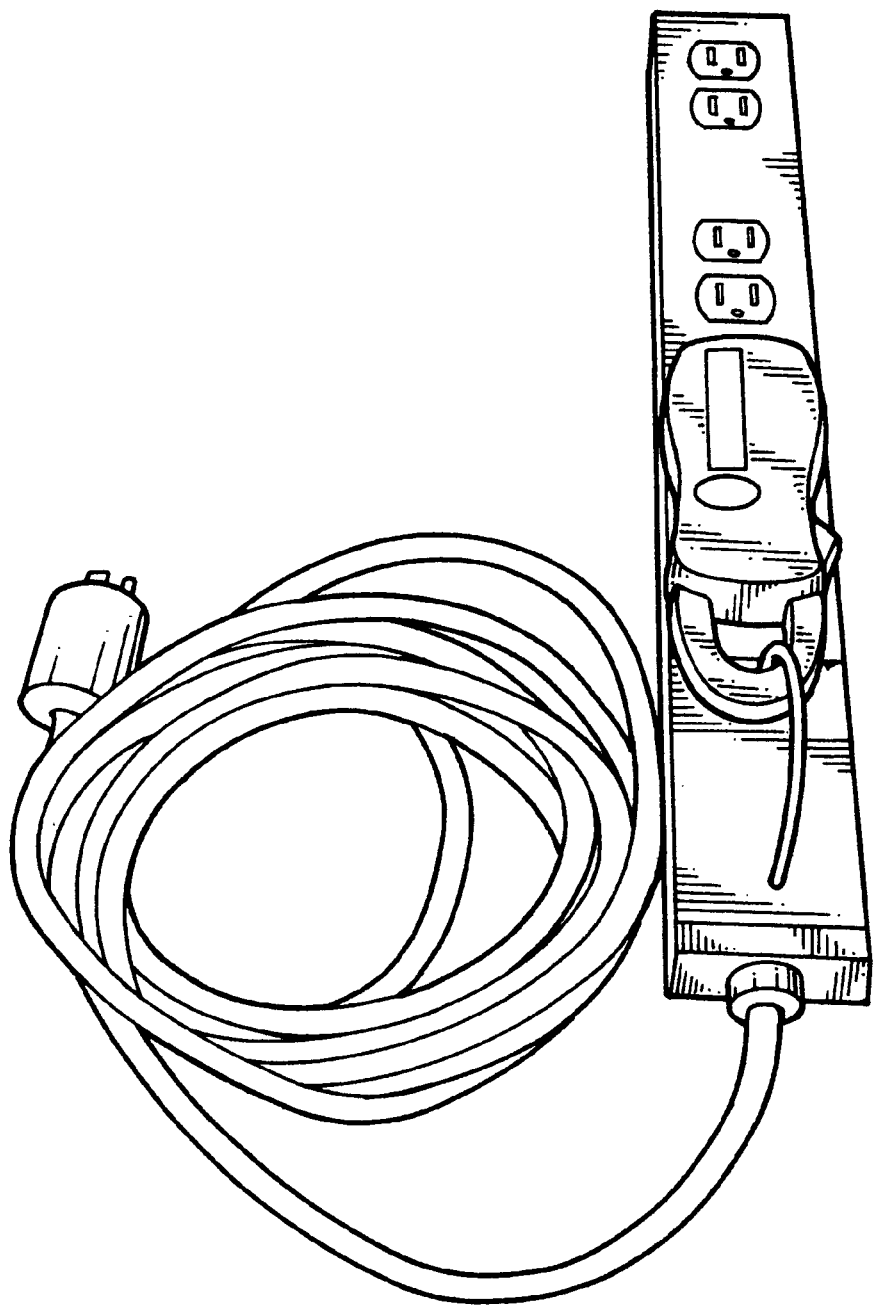
FIG. 16 is a measuring device engaging the power strip embodiment according to the present invention.

FIG. 15 shows an embodiment of the present invention where a place to sense electrical activity is provided on a power strip 1500. Available conductor 1502 provides a sensing location. Preferably, available conductor 1502 is sized and designed to accommodate a sensing device. Preferably, at least a portion of available conductor 1502 provides enough space away from power strip 1500 so that a sensing device can successfully engage available conductor 1502, as shown in FIG. 16. Available conductor 1502 can be connected to one, several, or all of the outlets found on power strip 1500. Preferably, available conductor 1502 is connected to all of the outlets on power strip 1500 so that a technician can evaluate information related to the total power flowing through power strip 1500.

Figure 17:
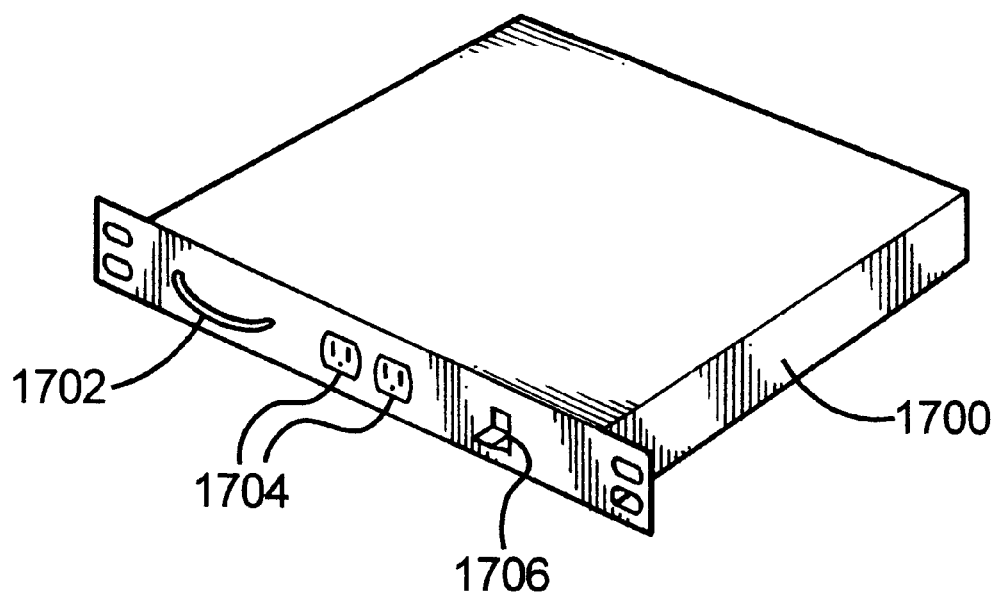
FIG. 17 is a rack-mount embodiment according to the present invention.

FIG. 17 shows an embodiment of the present invention where a place to sense electrical activity is provided on a rack mount component 1700. Rack mount component 1700 can be any type of rack mount component or include a combination of features found in rack mount components. Some examples include a power conditioner, a lighting or dimmer unit, a power distributor, a voltage regulator, an isolation transformer, a surge protector or a power filter. Available conductor 1702 provides a sensing location where a sensing device can engage available conductor 1702. Preferably, at least a portion of available conductor 1702 provides enough space away from rack mount component 1700 so that a sensing device can successfully engage available conductor 1702. The front panel of rack mount component 1700 can include one or more outlets 1704 and can also include a switch 1706.

Figure 18:
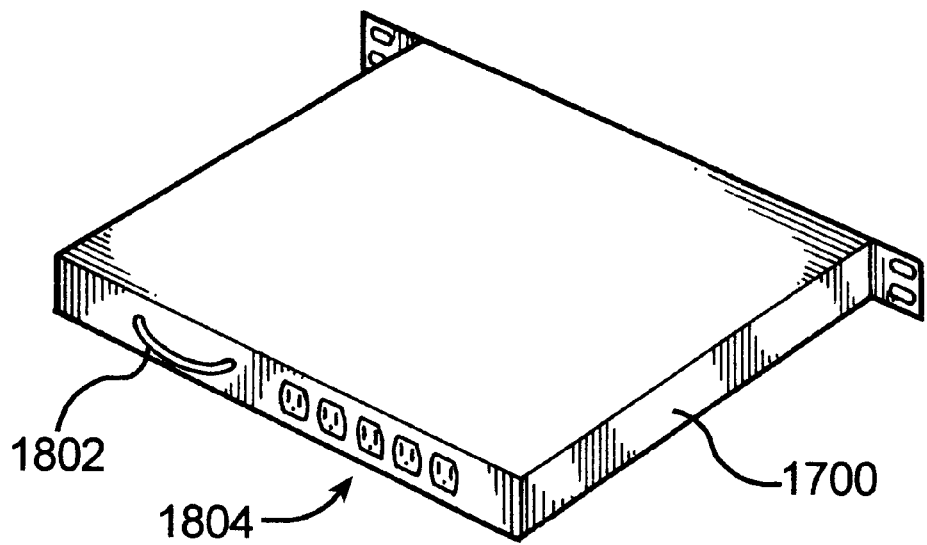
FIG. 18 is a rear view of the rack-mount embodiment according to the present invention.

FIG. 18 shows a rear view of rack mount component 1700. An available conductor 1802 can be disposed on a rear portion of rack mount component 1700. Rack mount component 1700 can include a front available conductor 1702, a rear available conductor 1802 or both. Outlets 1804 can also be provided on a rear portion of rack mount component 1700. Like other available conductors, available conductor 1702 and 1802 are preferably insulated and rigid.

Figure 19:
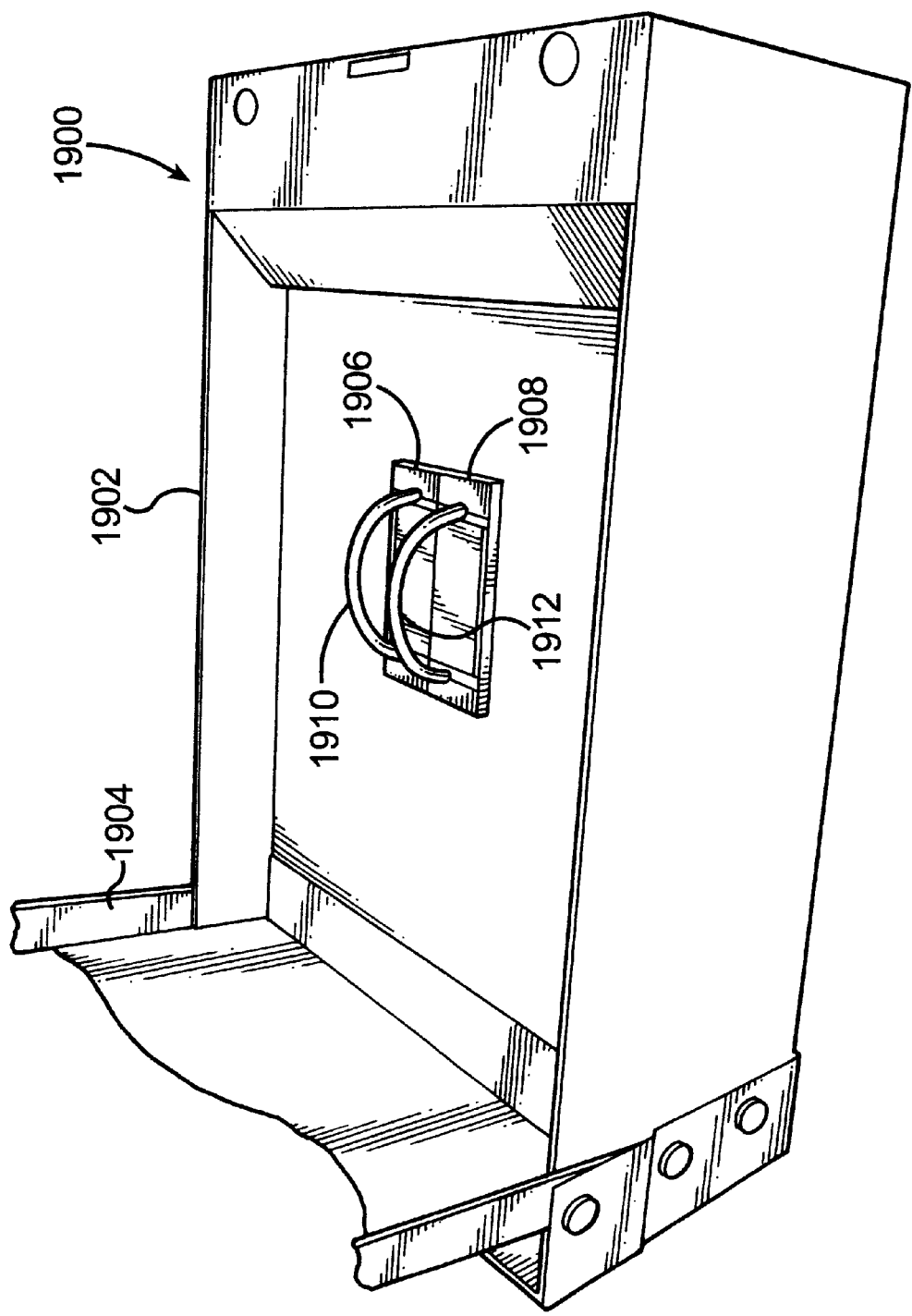
FIG. 19 is a box embodiment according to the present invention.
Figure 20:
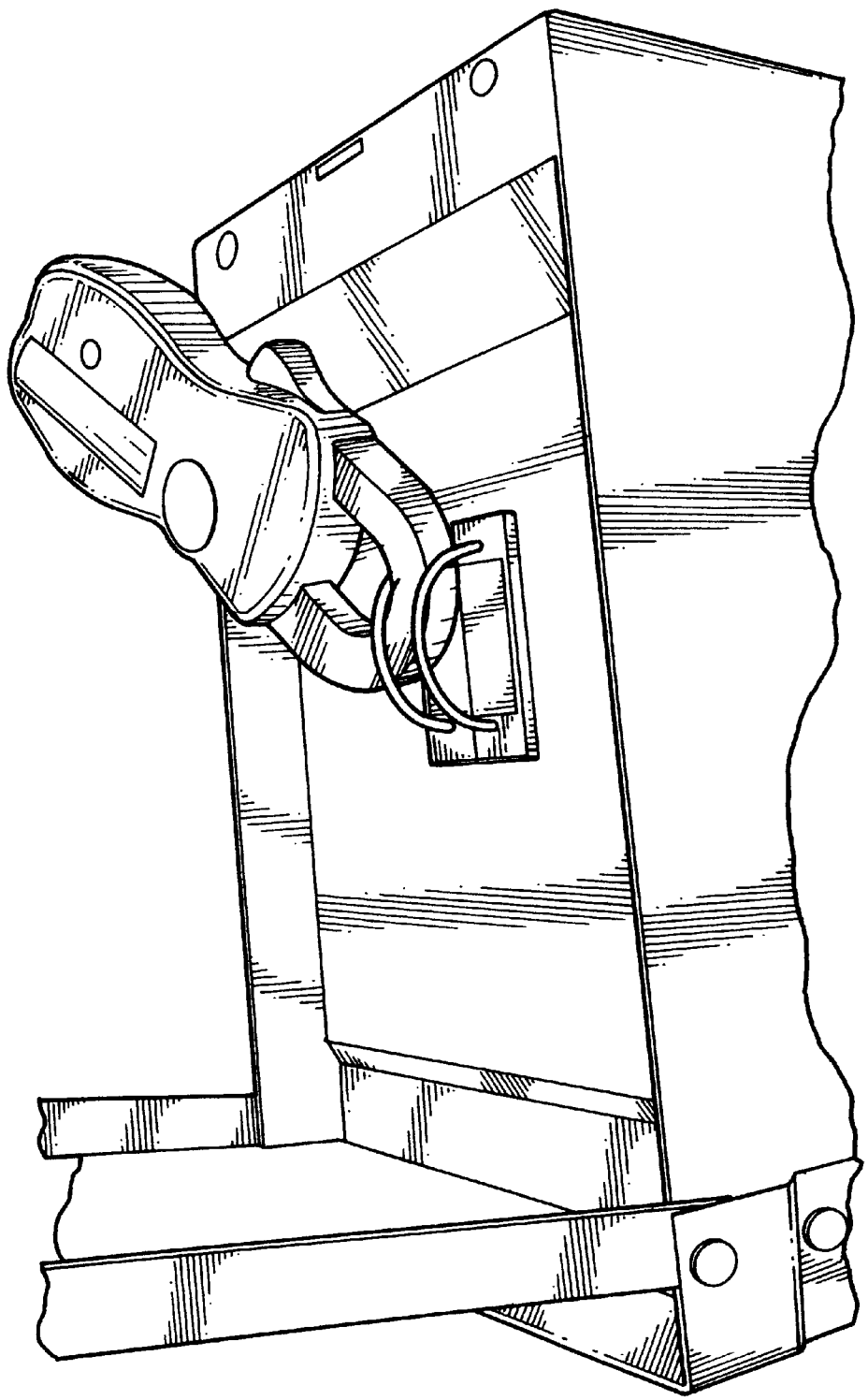
FIG. 20 is a measuring device engaging the preferred box embodiment according to the present invention.

FIG. 19 shows another embodiment of the present invention. In this embodiment, the place to sense electrical activity is preferably disposed in a box 1900. Box 1900 preferably includes a body portion 1902 and a lid 1904. Disposed in body portion 1902 is at least one breaker 1906. A second breaker 1908 could also be provided. Clearly, more breakers could also be disposed in body portion 1902. First breaker 1906 preferably includes an available conductor 1910 and second breaker 1908 preferably includes an available conductor 1912. Available conductors 1910 and 1912 are preferably spaced a sufficient distance away from each other and away from their respective breakers so that each of the available conductors 1910 and 1912 can accommodate a sensing device. Preferably, they are spaced in such a manner so that a first sensing device can engage first available conductor 1910 and a second sensing device can engage second available conductor 1912 at the same time.

FIG. 21 is an isometric view of an embodiment of an available conductor 2102. In this embodiment, available conductor 2102 is movable. Referring to FIGS. 22 and 23, preferably, available conductor 2102 is movable from a storage position, shown in FIG. 23 to a deployed position, as shown in FIG. 22. To accommodate the movement of available conductor 2102, a properly designed housing 2104 along with a properly designed retainer 2106 is used.

Housing 2104 provides sufficient space to store those portions of available conductor 2102 that are retracted into housing 2104 when available conductor 2102 is in its storage position. In other words, housing 2104 preferably includes an internal cavity 2112 that is large enough to hold exposed portions of available conductor 2102 and other items that may be required for deployment.

Retainer 2106 holds available conductor 2102 in a manner that permits available conductor 2102 to move from the storage position to a deployed position. In some embodiments, retainer 2106 can act as a hinge that permits available conductor 2102 to pivot as it deploys and as it assumes its stored position. The hinge could either be a live hinge or a mechanical hinge.

FIG. 22 shows one possible embodiment of hinge 2114. Hinge 2114 preferably includes a pivot shaft 2116 that permits available conductor 2102 to pivot with respect to housing 2104. Available conductor 2102 includes an insulating portion 2122 and a conductor 2118. Insulating portion 2122 includes a first hole 2120 that permits entry of conductor 2118 into an inner cavity of insulating portion 2122. Insulating portion 2122 is fixed to pivoting shaft 2116, and insulating portion 2122 can pivot with respect to housing 2104 in cooperation with pivoting shaft 2116. Insulating portion 2122 also includes a second end 2124 with a second hole 2126. As shown in FIG. 22, which shows the deployed position of available conductor 2102, when available conductor 2102 is in the deployed condition, a space 2130 between housing 2104 and available conductor 2102 is formed. This spacing is sufficient to permit a portable ammeter to engage available conductor 2102 and determine the electrical activity of available conductor 2102.

Optionally, if a flush surface is desired, a groove or recess 2108 can be provided. This groove 2108 allows available conductor 2102 to lie with groove 2108 when available conductor 2102 is in its storage position. Groove 2108 can be designed so that the outer portion of available conductor 2102 does not protrude above the surface 2110. In this way, available conductor 2102 is generally flush with surface 2110 when available conductor 2102 is in its stored position.

FIG. 23 shows available conductor 2102 in the stored condition. Preferably, a groove 2108 is used to permit available conductor 2102 to rest flush with surface 2110.

Figure 25:
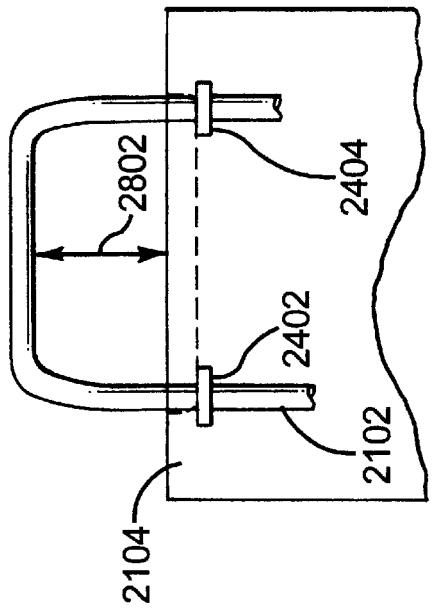
FIG. 25 is a side view of another embodiment of a movable available conductor in a deployed position.
Figure 24:
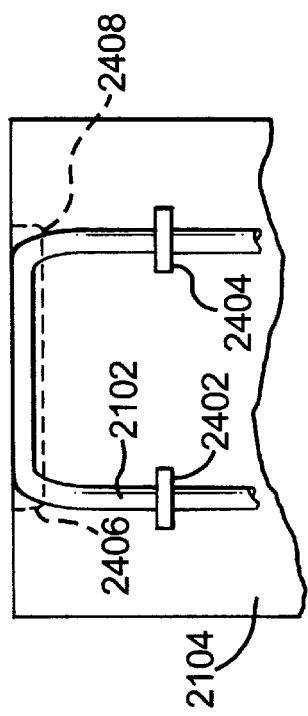
FIG. 24 is a side view of another embodiment of a movable available conductor in a non-use position.

FIGS. 24 and 25 show another embodiment of the present invention. In the embodiment shown in FIGS. 24 and 25, retaining washers 2402 and 2404 are used to retain portions of available conductor 2102 within housing 2104. Preferably, retaining washers 2402 and 2404 are fixed at desired locations on available conductor 2102 and are sized to be larger than holes 2406 and 2408.

In this way, retaining washers 2402 and 2404 are able to retain portions of available conductor 2102 when available conductor 2102 assumes its deployed condition as shown in FIG. 25. Similar to other embodiments of the present invention, available conductor 2102 is spaced a distance 2502 from housing 2104 in the deployed condition. This spacing is sufficient to permit a portable ammeter to engage available conductor 2102 and determine the electrical activity of available conductor 2102.

Figure 27:
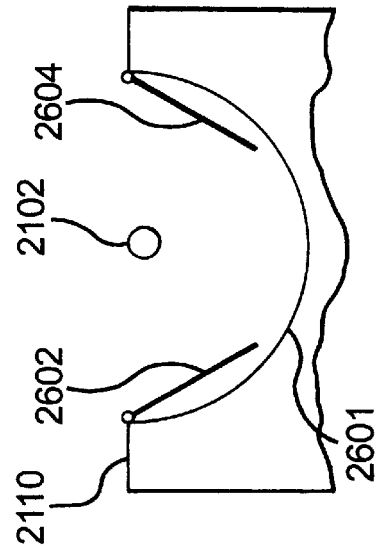
FIG. 27 is a cross-sectional view of an embodiment of a door in the open position.
Figure 26:
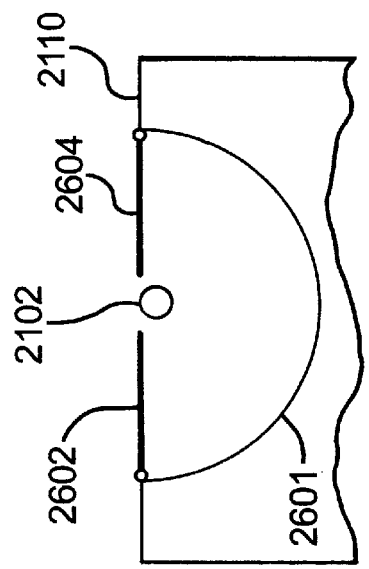
FIG. 26 is a cross-sectional view of an embodiment of a door in the closed position.
Figure 31:
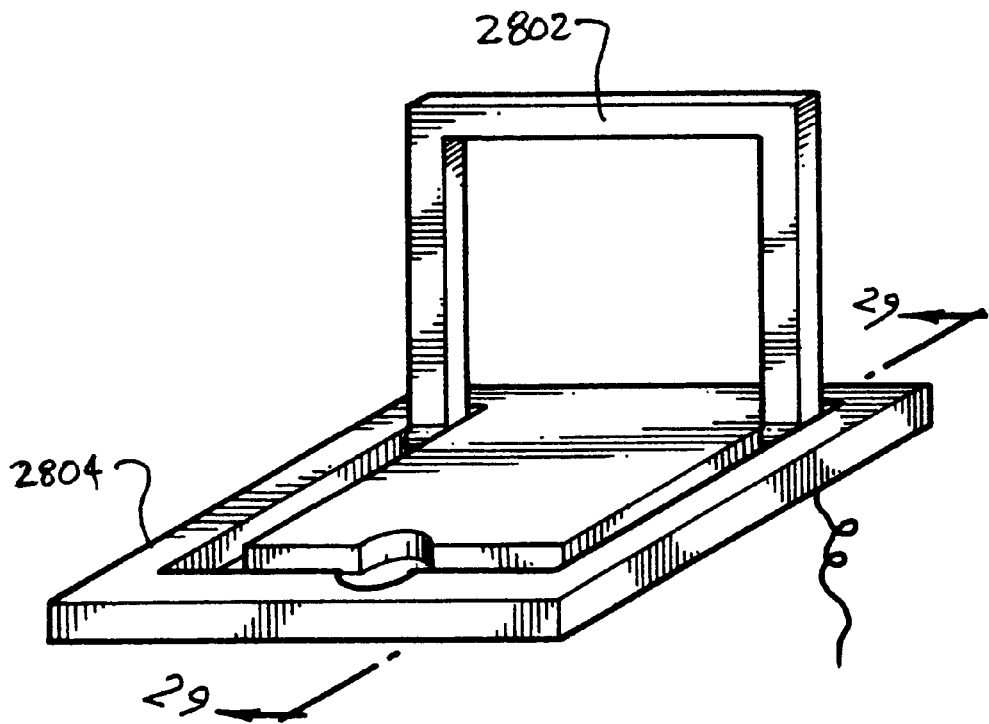
FIG. 31 is an isometric view of another embodiment of a movable available conductor.

FIGS. 26 and 27 show optional doors 2602 and 2604 that can be used. Referring to FIG. 21, housing 2104 can include a finger recess 2601. Finger recess 2601 is a cavity disposed under available conductor 2102 to permit a user to more easily grasp available conductor 2102 when available conductor 2102 is in its storage position. Referring to FIGS. 26 and 27, optional doors 2602 and 2604 can be disposed on either side of finger recess 2601 to cover respective sides of finger recess 2601. This provides a flush appearance to surface 2110. The doors 2602 and 2604 are preferably pivotable, as shown in FIGS. 26 and 27, and can also be spring biased towards the extended configuration shown in FIG. 26.

FIGS. 28–31 show another embodiment of the present invention. In this embodiment, available conductor 2802 assumes a form similar to a hinged drawer pull. As shown in FIG. 28, available conductor 2802 is pivoted with respect to housing 2804 and can assume a deployed condition, as shown in FIG. 28, and a storage condition. In the deployed condition, a portion of available conductor 2802 attains a spacing from housing 2804 that is sufficient to permit a portable ammeter to engage available conductor 2102 and determine the electrical activity of available conductor 2802. Housing 2804 can include a recess 2806 that can accommodate available conductor 2802 in the storage position. Preferably, recess 2806 is sized so that available conductor 2802 is flush with the surface 2808 of housing 2804 when available conductor 2802 is in its stored position.

FIG. 29 shows an enlarged cross sectional view of available conductor 2802. Available conductor 2802 includes an insulating portion 2902 and a conductor 2904. Preferably, insulating portion 2902 includes a hole 2906 that permits conductor 2904 to enter the interior of insulating portion 2902. Preferably, available conductor 2802 is symmetrical, and the other side of available conductor 2802 is similar to the configuration shown in FIG. 29. Using the system shown in FIG. 29, conductor 2904 can enter one end of insulating portion 2902 and exit the other end. In this way, a pivoting available conductor 2802 can deploy from a storage position and provide a suitable location to measure the electrical activity of conductor 2904. FIG. 30 shows the possible range of motion 3003 of available conductor 2802.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

I claim:

1. An apparatus with separated conductors comprising:
 a chassis adapted to receive a first conductor and second conductor;
 a portion of the first conductor being separated from the chassis and the second conductor a distance sufficient to accommodate a portable, handheld current-sensing device;
 the portion of first conductor having an insulating jacket and being less flexible than the flexibility of the first conductor without the insulating jacket;
 the insulating jacket being substantially rigid, and being made of a non-metallic martial;
 wherein the insulating jacket is mechanically connected to a side of the chassis and extending outwardly from the side of the chassis in a substantial half-loop shape;
 wherein the side of the chassis is insulated; and
 wherein the operation of the portable, handheld current-sensing device does not influence the current flow through the apparatus and wherein the apparatus continues to provide electricity even if the portable, handheld current-sensing device malfunctions.

2. The apparatus according to claim 1, wherein the apparatus is insulated and does not include an exposed conductive surface in communication with the first conductor or the second conductor.

3. The apparatus according to claim 1, wherein the first conductor is insulated and does not include an exposed conductive surface in communication with the first conductor.

4. The apparatus according to claim 1, wherein a first end of the apparatus includes a connector.

5. The apparatus according to claim 1, wherein a first end of the apparatus includes a female connector.

6. The apparatus according to claim 1, wherein a first end of the apparatus includes a male connector.

7. The apparatus according to claim 1, wherein the second conductor is separated from the chassis and the first conductor a distance sufficient to accommodate a portable, handheld current-sensing device.

8. The apparatus according to claim 1, wherein a third conductor is separated from the chassis and the first conductor and the second conductor a distance sufficient to accommodate a portable, handheld current-sensing device.

9. The apparatus according to claim 1, wherein a hole is disposed in the apparatus and the first conductor is disposed in a groove on one side of the hole and the second conductor is disposed in a groove on the other side of the hole.

10. A power strip comprising:
- a chassis adapted to receive a first conductor and second conductor;
- a portion of the first conductor being separated from the chassis and the second conductor a distance sufficient to accommodate a portable, handheld current-sensing device;
- the portion of first conductor having an insulating jacket and being less flexible than the flexibility of the first conductor without the insulating jacket;
- the insulating jacket being substantially rigid, and being made of a non-metallic material;
- wherein the insulating jacket is mechanically connected to a side of the chassis and extending outwardly from the side of the chassis in a substantial half-loop shape;
- wherein the side of the chassis is insulated; and
- wherein the operation of the portable, handheld current-sensing device does not influence the current flow through the apparatus and wherein the apparatus continues to provide electricity even if the portable, handheld current-sensing device malfunctions.

11. The power strip of claim 10, wherein the side of the chassis also includes at least one electrical connector adapted to receive a plug.

12. The power strip of claim 11, wherein the first conductor is in communication with the electrical connector.

13. The power strip of claim 10, wherein the side of the chassis also includes a plurality of electrical connectors adapted to receive respective plugs.

14. The power strip of claim 13, wherein the first conductor is in communication with every one of the plurality of electrical connectors.

15. The power strip of claim 10, wherein the power strip is entirely insulated thereby having no exposed energized parts.

16. The power strip of claim 10, wherein the portable, handheld cent-sensing device can be removed without disrupting electrical power.

17. A rack mount component including provisions to permit association with standard racks comprising:
- a chassis adapted to receive a first conductor and second conductor;
- a portion of the first conductor being separated from the chassis and the second conductor a distance sufficient to accommodate a portable, handheld current-sensing device;
- the portion of first conductor having an insulating jacket and being less flexible than the flexibility of the first conductor without the insulating jacket;
- the insulating jacket being substantially rigid, and being made of a non-metallic material;
- wherein the insulating jacket is mechanically connected to a side of the chassis and extending outwardly from the side of the chassis in a substantial half-loop shape,
- wherein the side of the chassis is insulated; and
- wherein the open of the portable, handheld current-sensing device does not influence the current flow through the apparatus and wherein the apparatus continues to provide electricity even if the portable, handheld current-sensing device malfunctions.

18. The rack mount component of claim 17, wherein the side of the chassis also includes a plurality of electrical connectors adapted to receive respective plugs.

19. The rack mount component of claim 17, wherein a second side, facing a different direction than the side including the insulating jacket, includes at least one electrical connector adapted to receive a plug.

20. The rack mount component of claim 17, further comprising a surge protector.

21. The rack mount component of claim 17, further comprising a power conditioner.

22. The rack mount component of claim 17, further comprising an isolation transformer.

23. The rack mount component of claim 17, further comprising a voltage regulator.

24. The rack mount component of claim 17, further comprising a power filter.

25. The rack mount component of claim 17, wherein the rack mount component is entirely insulated thereby having no exposed energized parts.

26. The rack mount component of claim 17, wherein the portable, handheld current-sensing device can be removed without disrupting electrical power.

* * * * *